(12) United States Patent
Oka

(10) Patent No.: US 11,217,290 B2
(45) Date of Patent: Jan. 4, 2022

(54) SEMICONDUCTOR DEVICE

(71) Applicant: SONY SEMICONDUCTOR SOLUTIONS CORPORATION, Kanagawa (JP)

(72) Inventor: Mikio Oka, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/959,716

(22) PCT Filed: Dec. 20, 2018

(86) PCT No.: PCT/JP2018/046922
§ 371 (c)(1),
(2) Date: Jul. 2, 2020

(87) PCT Pub. No.: WO2019/138828
PCT Pub. Date: Jul. 18, 2019

(65) Prior Publication Data
US 2020/0349993 A1      Nov. 5, 2020

(30) Foreign Application Priority Data

Jan. 11, 2018   (JP) .............................. JP2018-002844

(51) Int. Cl.
*G11C 11/16*     (2006.01)
*H01L 27/22*     (2006.01)
(52) U.S. Cl.
CPC ...... *G11C 11/1657* (2013.01); *G11C 11/1659* (2013.01); *H01L 27/228* (2013.01)
(58) Field of Classification Search
None
See application file for complete search history.

(56) References Cited

U.S. PATENT DOCUMENTS

2004/0141368 A1   7/2004 Inaba
2009/0201717 A1   8/2009 Maeda et al.
(Continued)

FOREIGN PATENT DOCUMENTS

CN   103548086 A    1/2014
JP   2004220759  *  1/2004
(Continued)

OTHER PUBLICATIONS

International Search Report and Written Opinion of PCT Application No. PCT/JP2018/046922, dated Mar. 5, 2019, 09 pages of ISRWO.

*Primary Examiner* — James G Norman
(74) *Attorney, Agent, or Firm* — Chip Law Group

(57) ABSTRACT

A semiconductor device of the present disclosure includes: a first gate electrode that includes a first main line section and one or a plurality of first sub line sections, in which the first main line section extends in a first direction in a first active region of a semiconductor substrate, and segments the first active region into a first region and a second region, and the one or the plurality of first sub line sections extends from the first main line section in a second direction intersecting the first direction in the first region, and segments the first region into a plurality of sub regions including a first sub region and a second sub region; a first memory element that includes a first terminal, and a second terminal coupled to the first sub region of the semiconductor substrate, and is configured to be set in a first resistive state or a second resistive state; and a second memory element that includes a first terminal, and a second terminal coupled to the second sub region of the semiconductor substrate, and is configured to be set in the first resistive state or the second resistive state.

10 Claims, 19 Drawing Sheets

(56) References Cited

U.S. PATENT DOCUMENTS

2011/0267874 A1   11/2011  Ryu et al.
2014/0092665 A1    4/2014  Ueda et al.

FOREIGN PATENT DOCUMENTS

| JP | 2004-220759 A | 8/2004 |
| JP | 2009-187631 A | 8/2009 |
| JP | 2009-260083 A | 11/2009 |
| JP | 2012-256690 A | 12/2012 |
| WO | 2011/136965 A1 | 11/2011 |
| WO | 2013/005364 A1 | 1/2013 |

* cited by examiner

[FIG. 1]
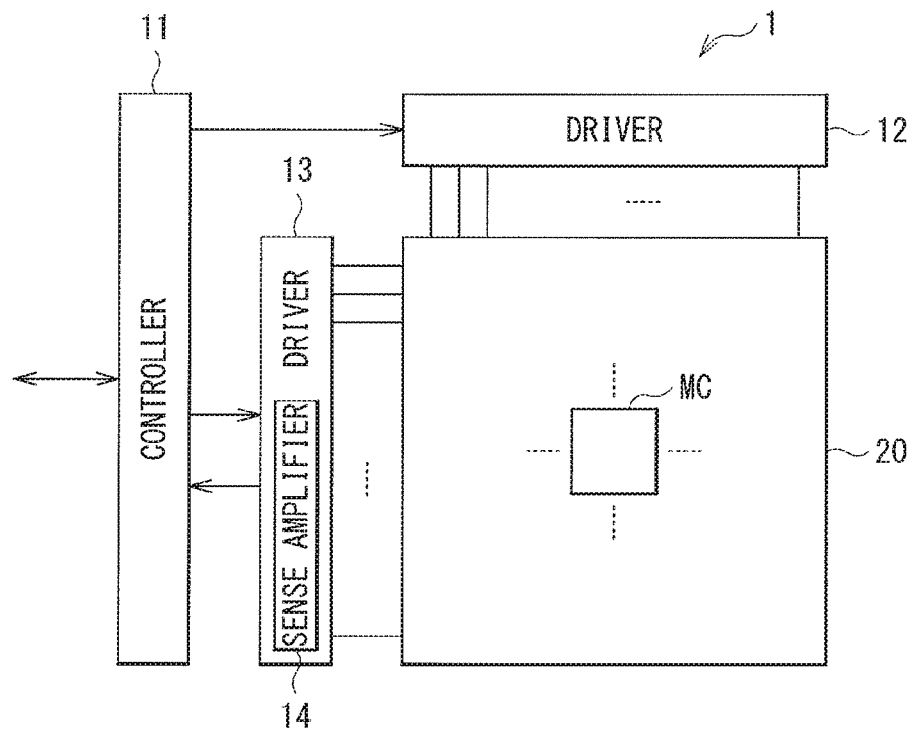
[FIG. 2]
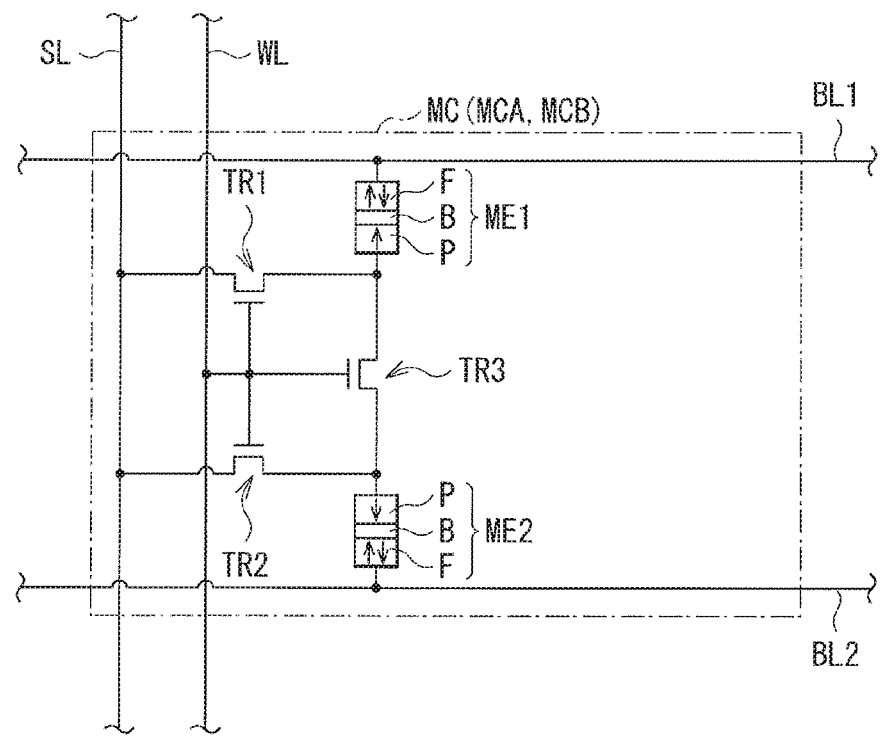

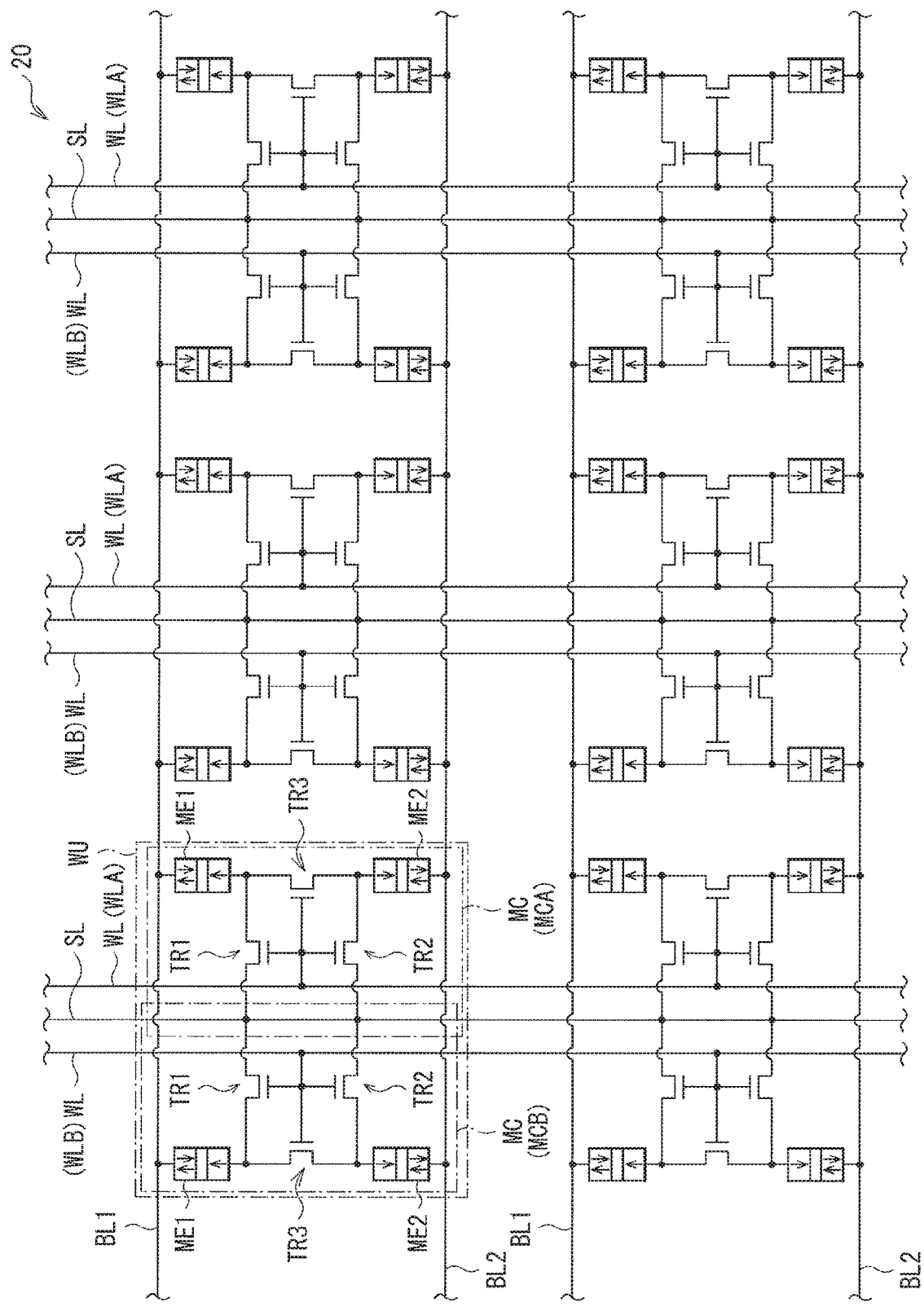
[FIG. 3]

[FIG. 4]
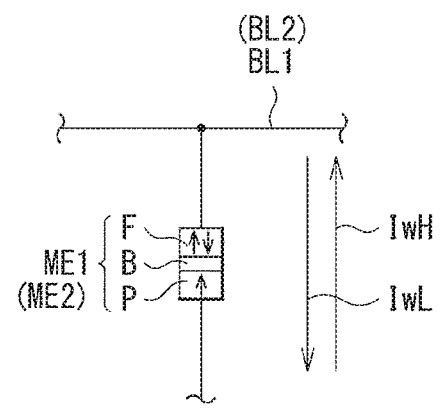

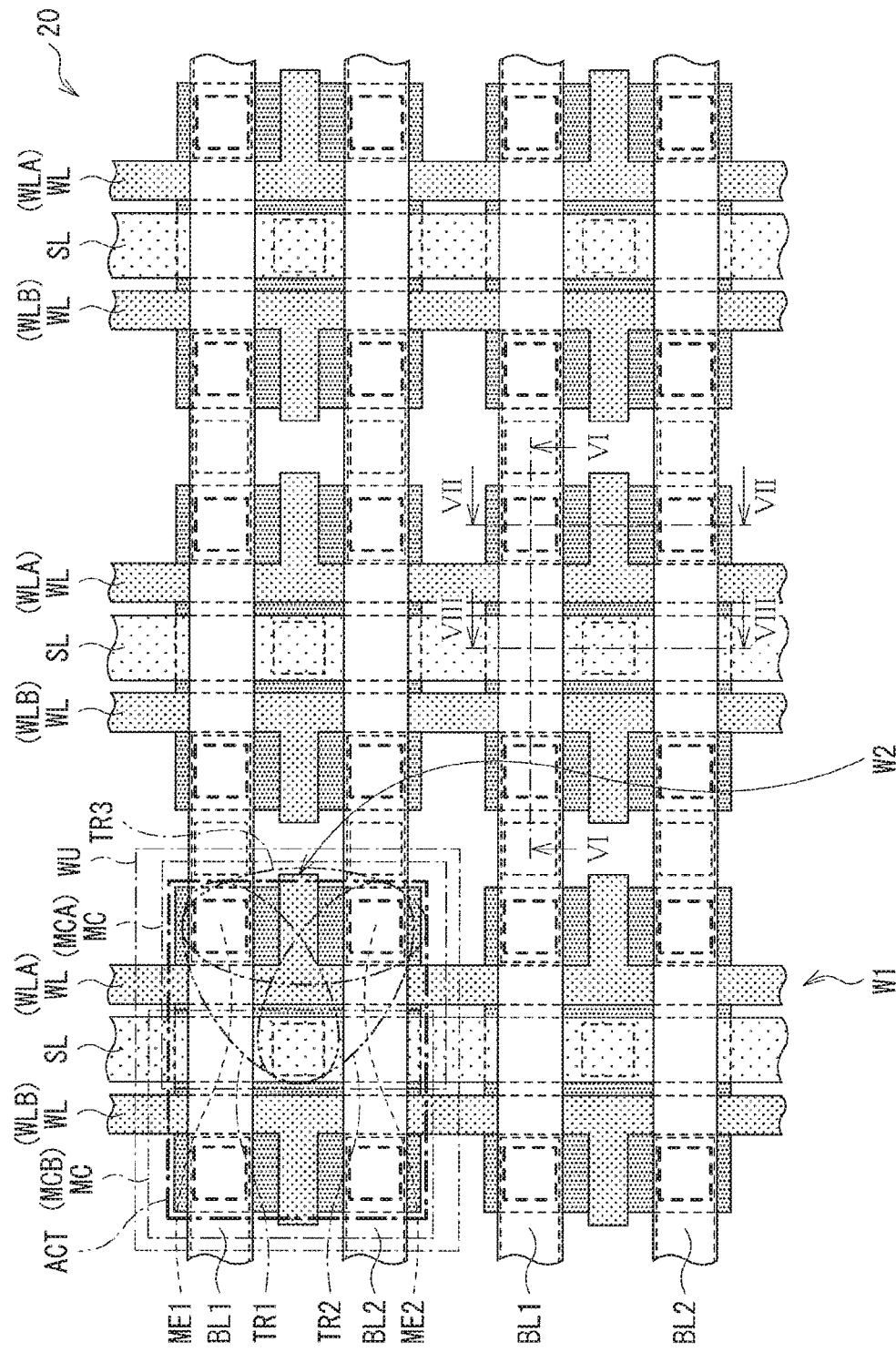
[FIG. 5]

[FIG. 6]
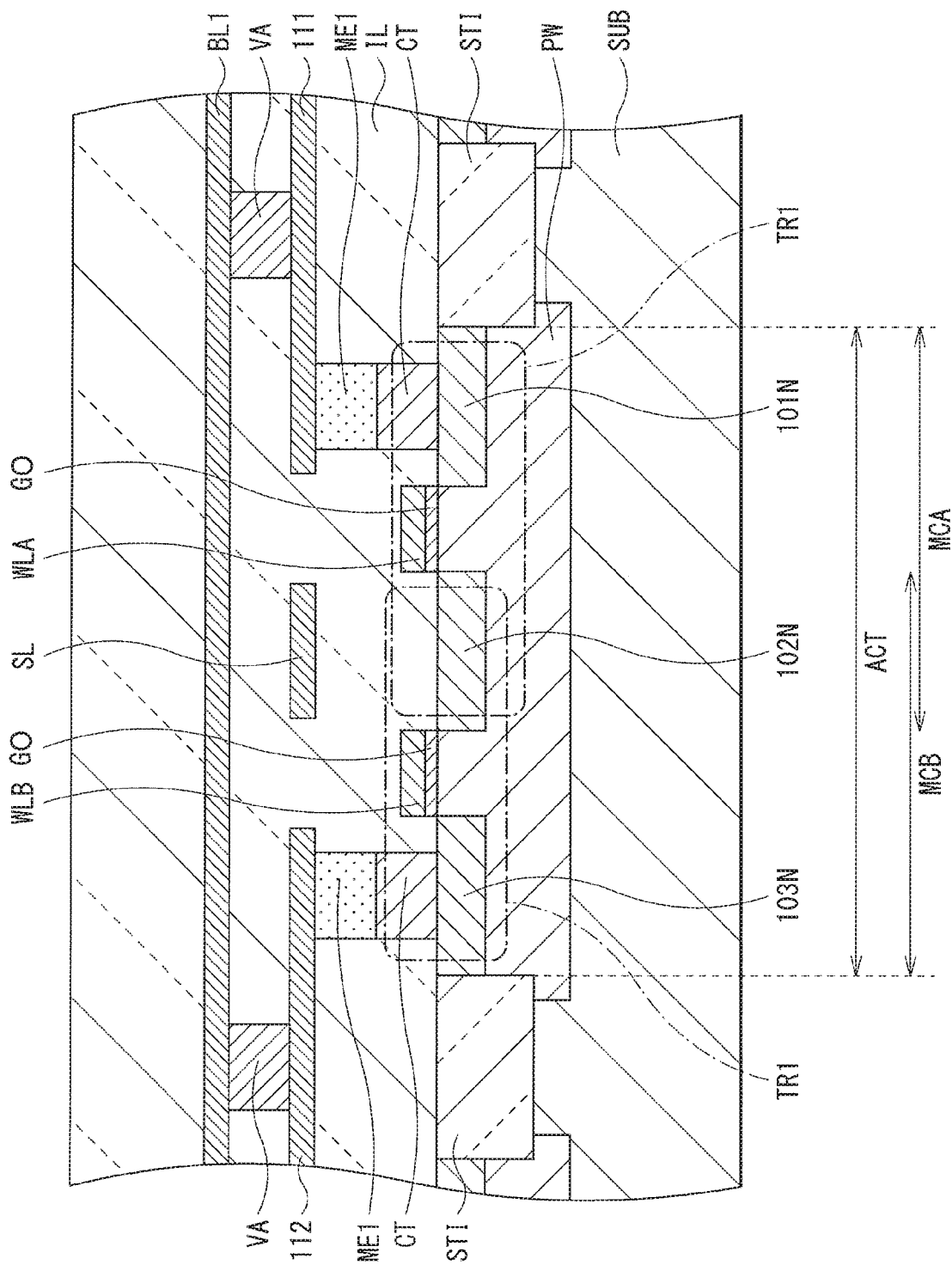

[FIG. 7]
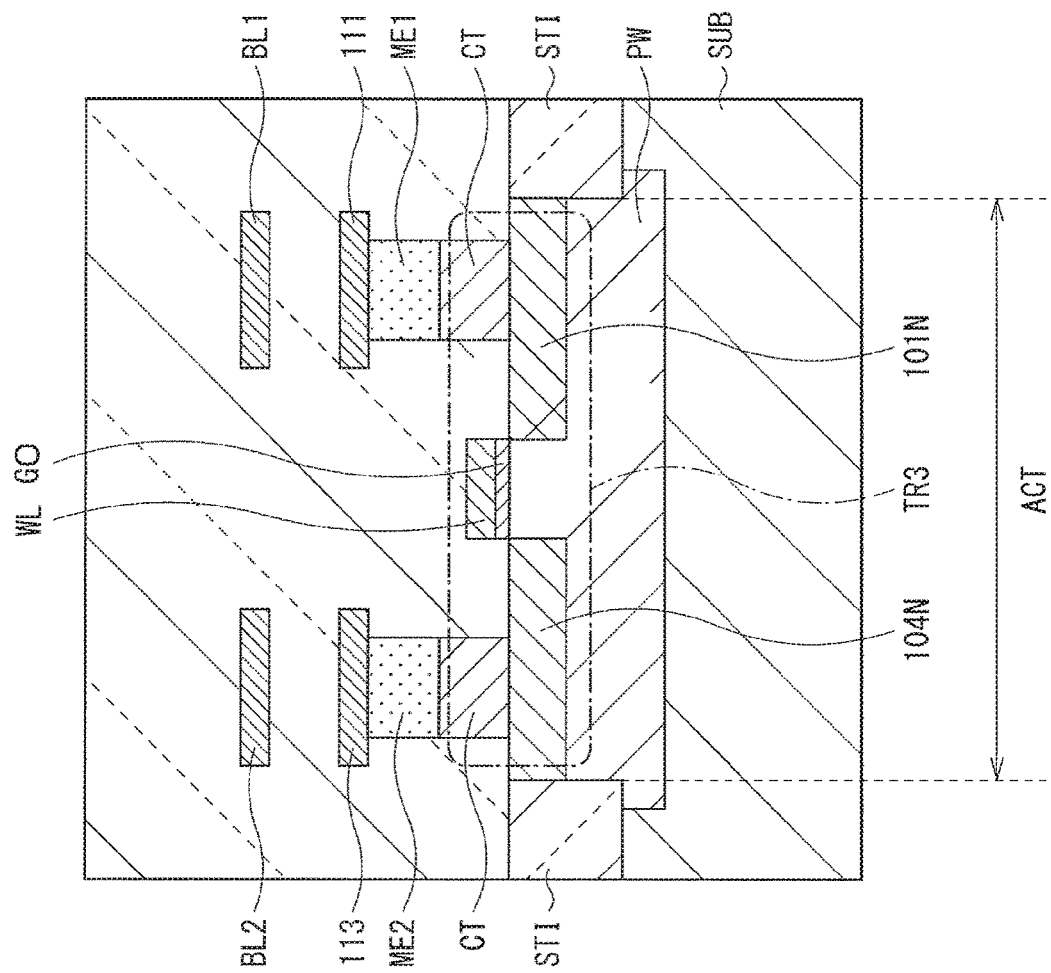

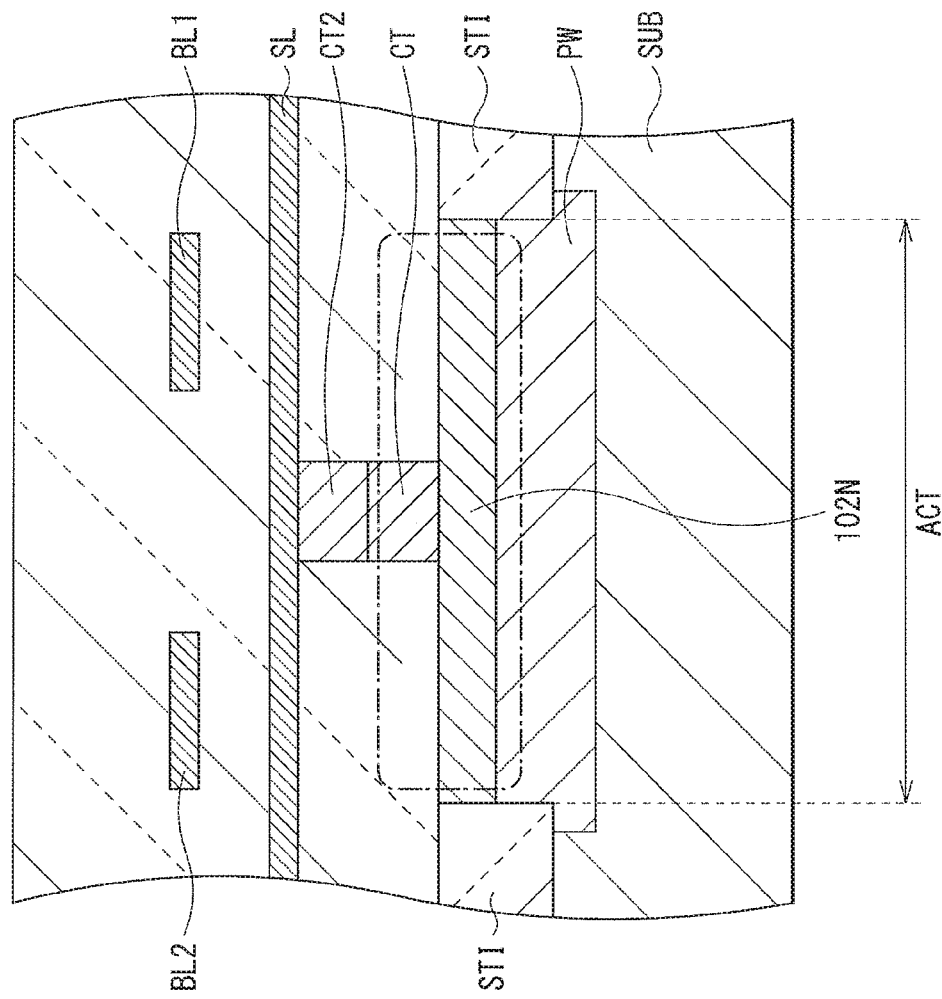
[FIG. 8]

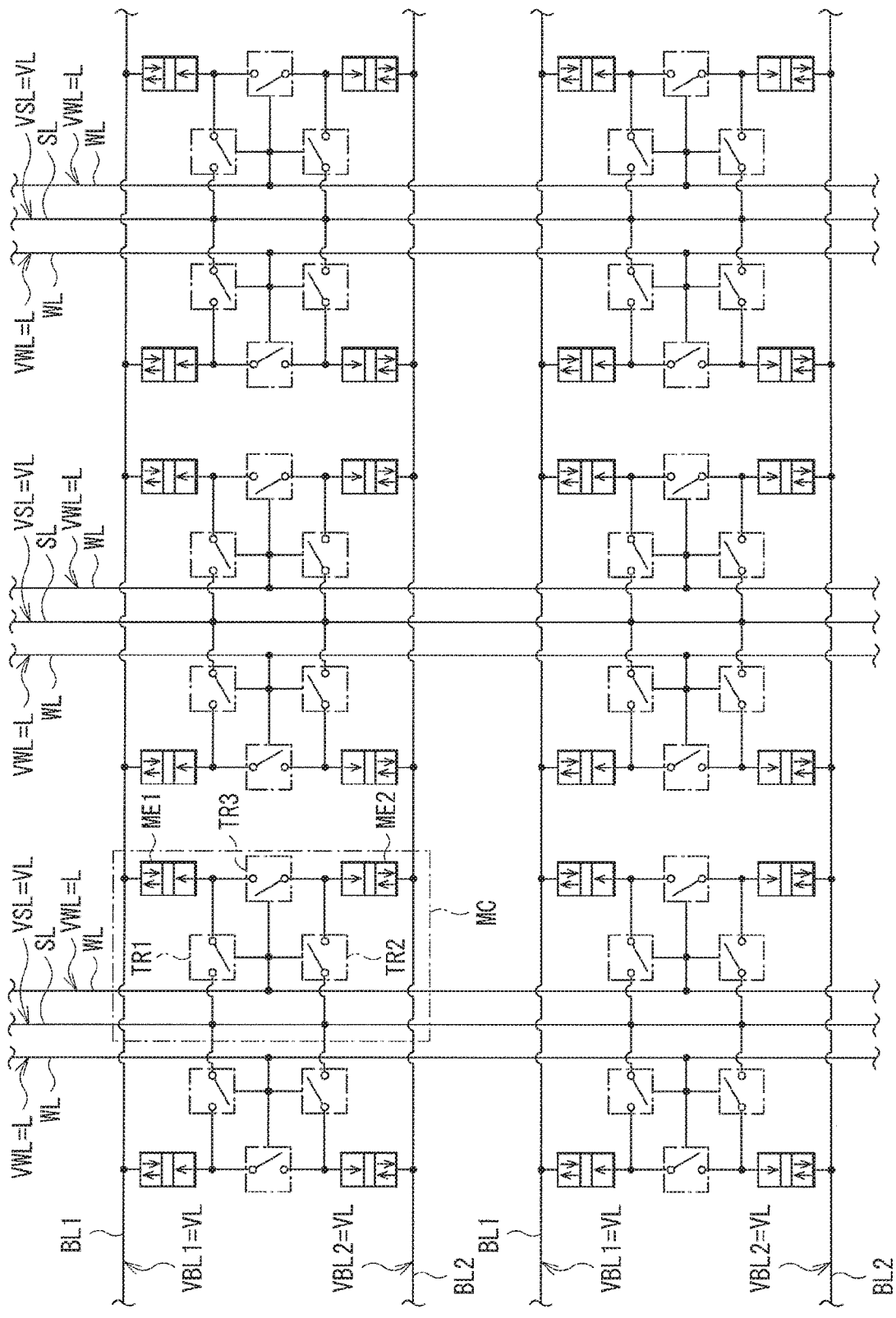
[FIG. 9]

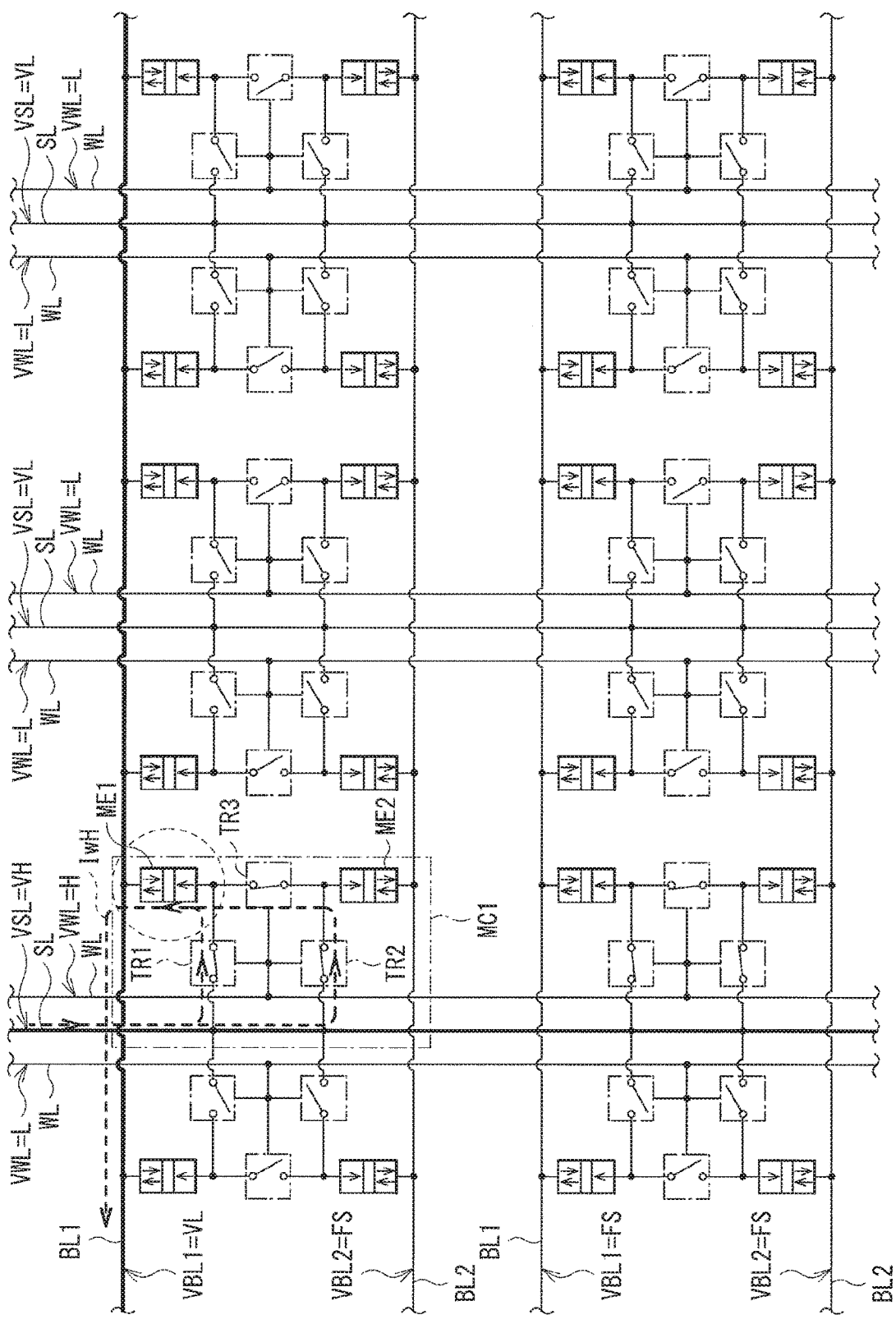
[FIG. 10]

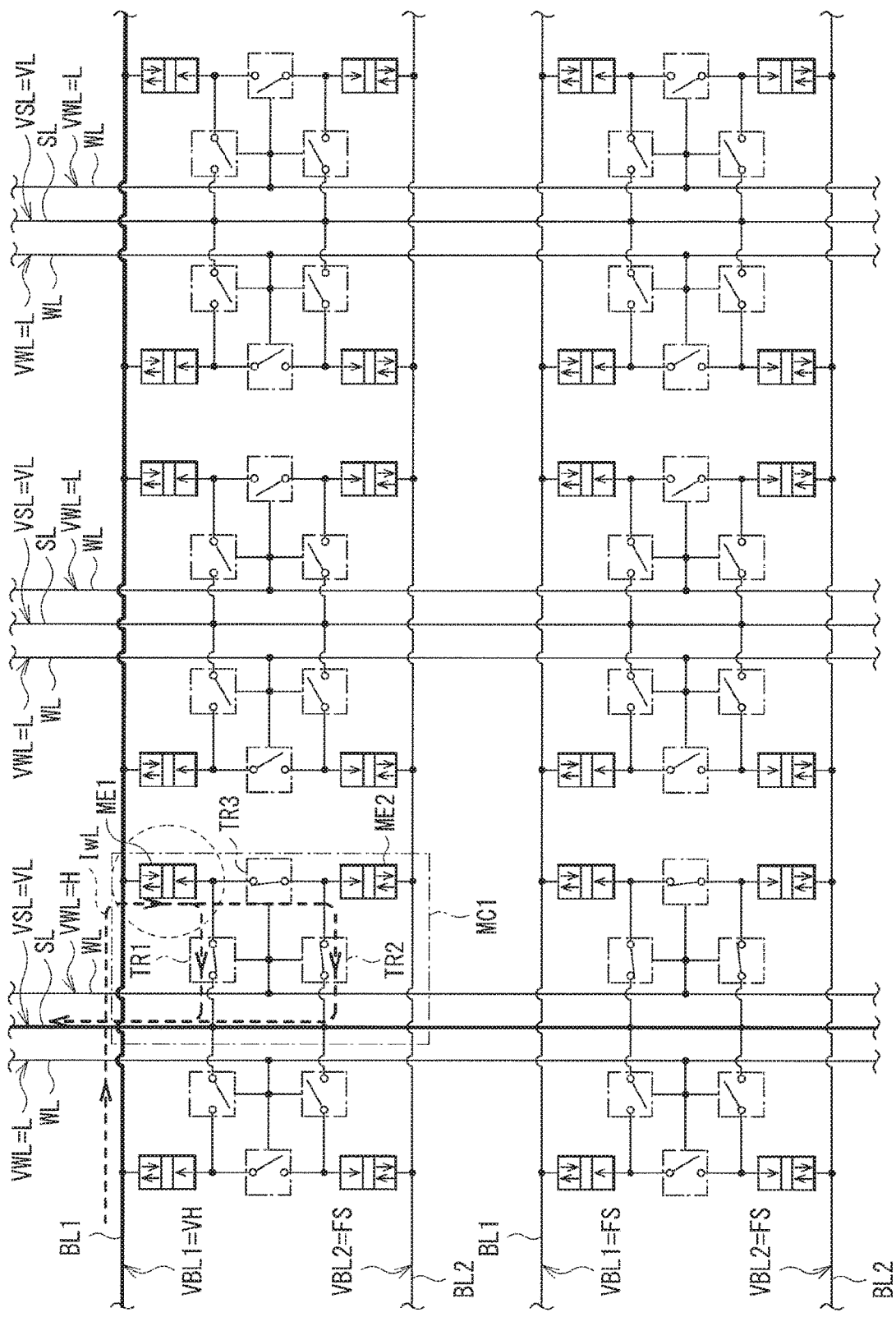
[FIG. 11]

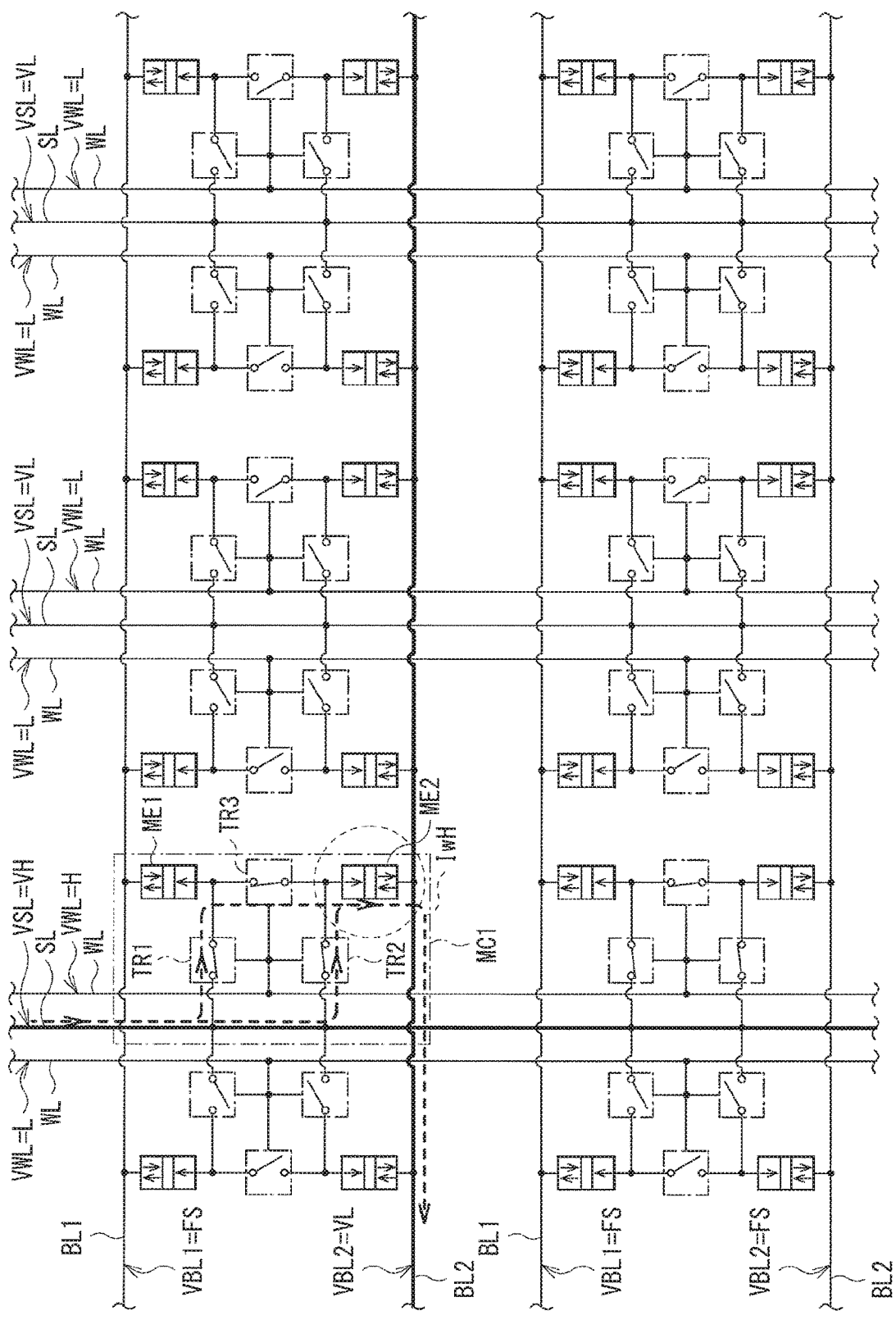
[FIG. 12]

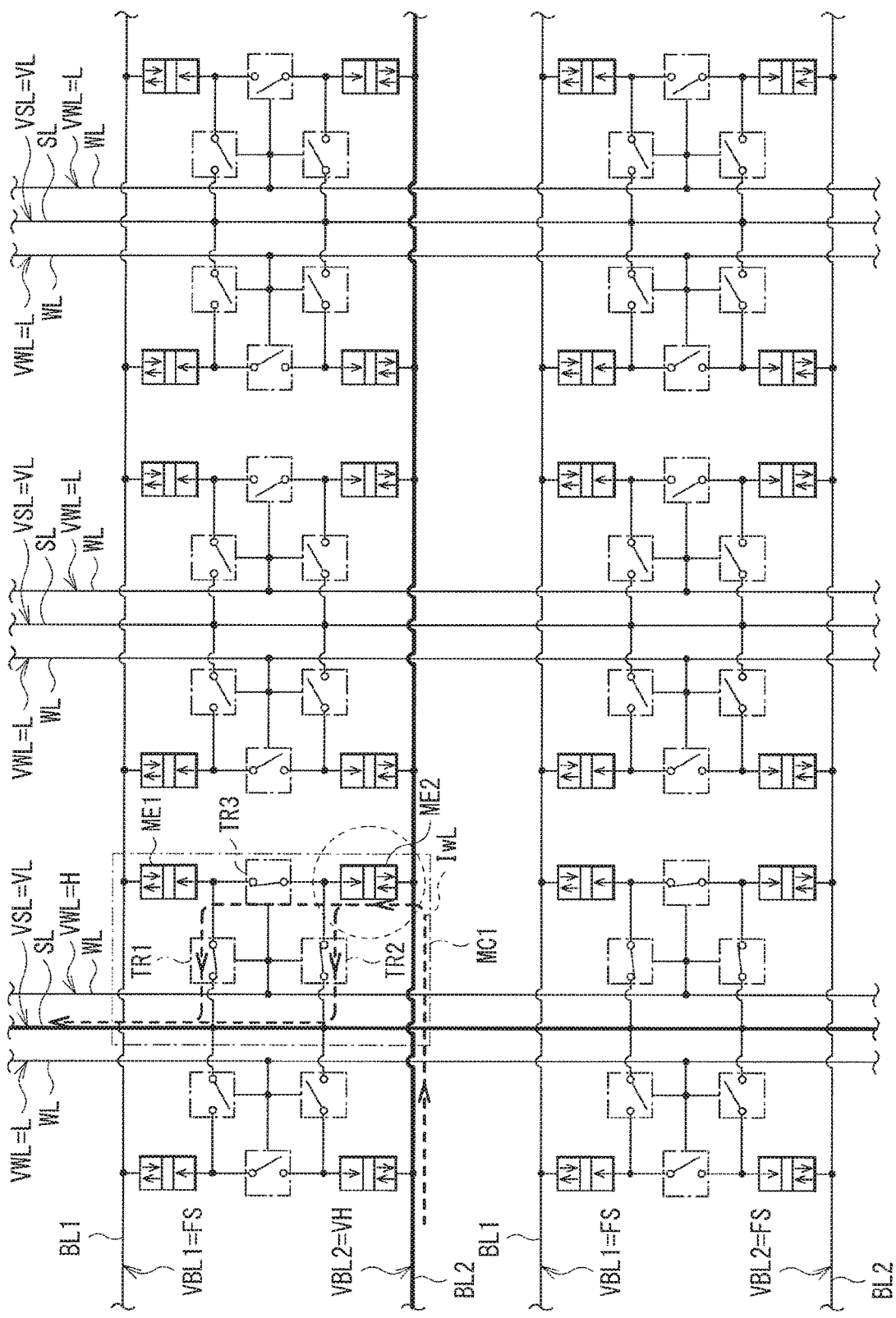
[FIG. 13]

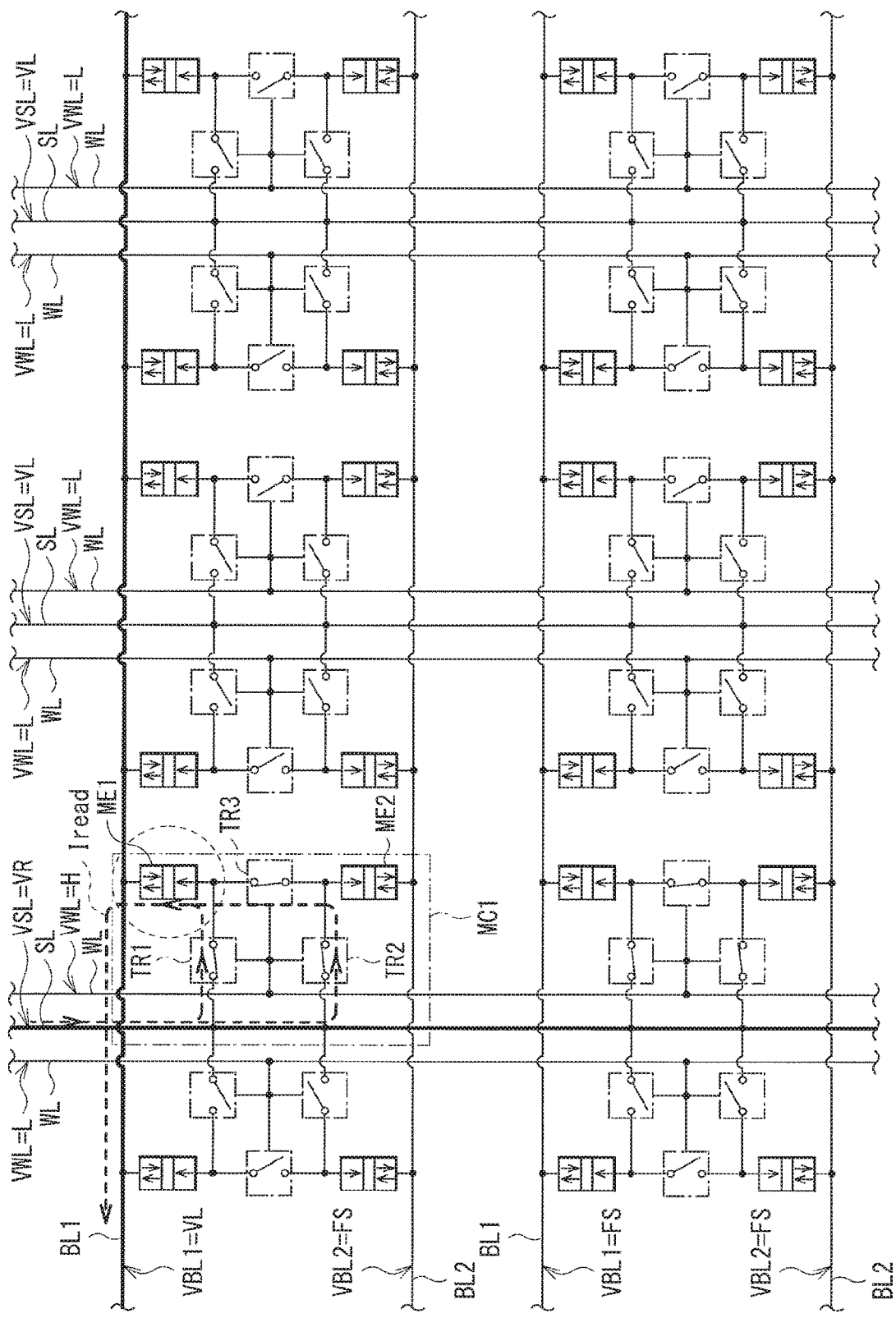
[FIG. 14]

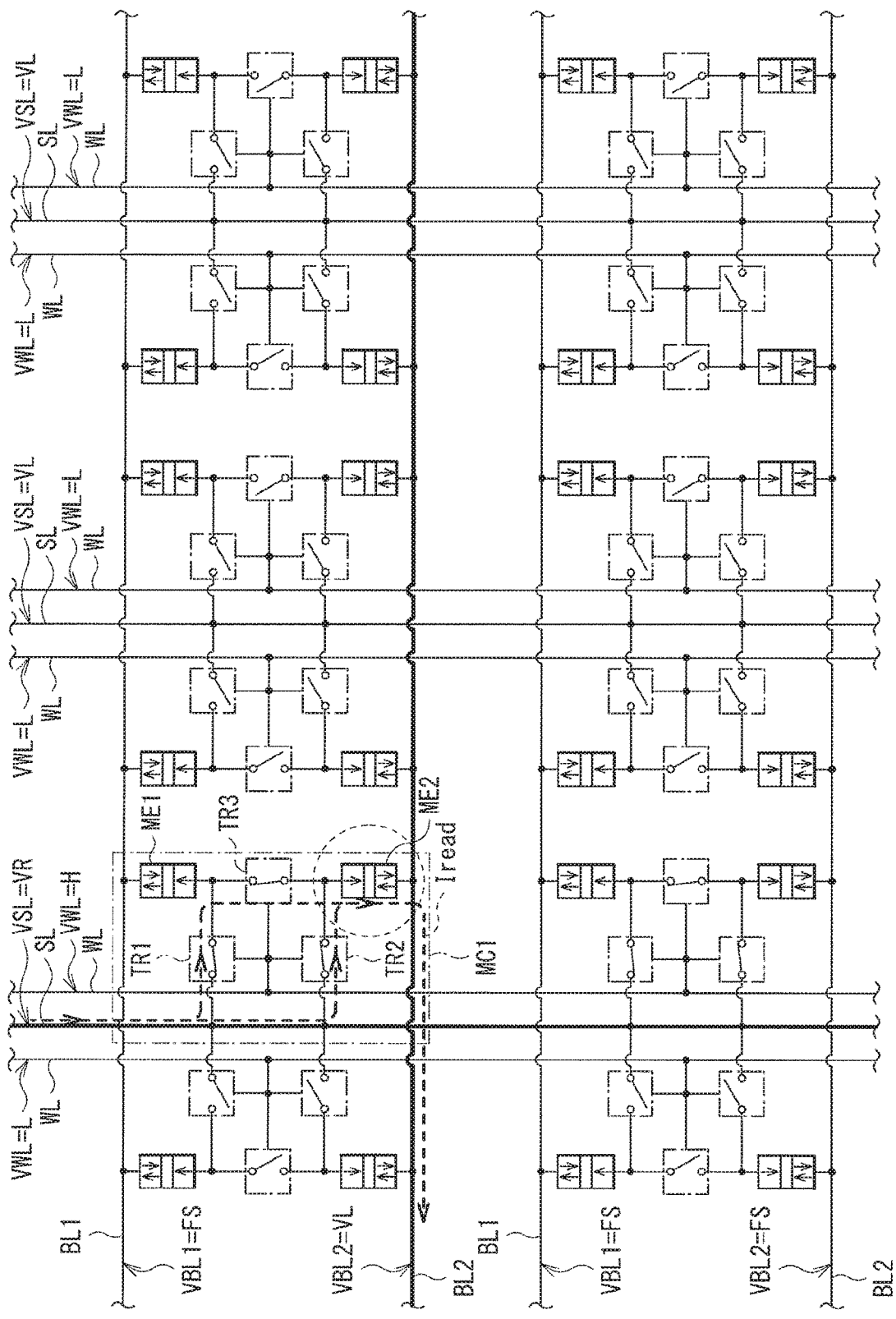
[FIG. 15]

[FIG. 16]
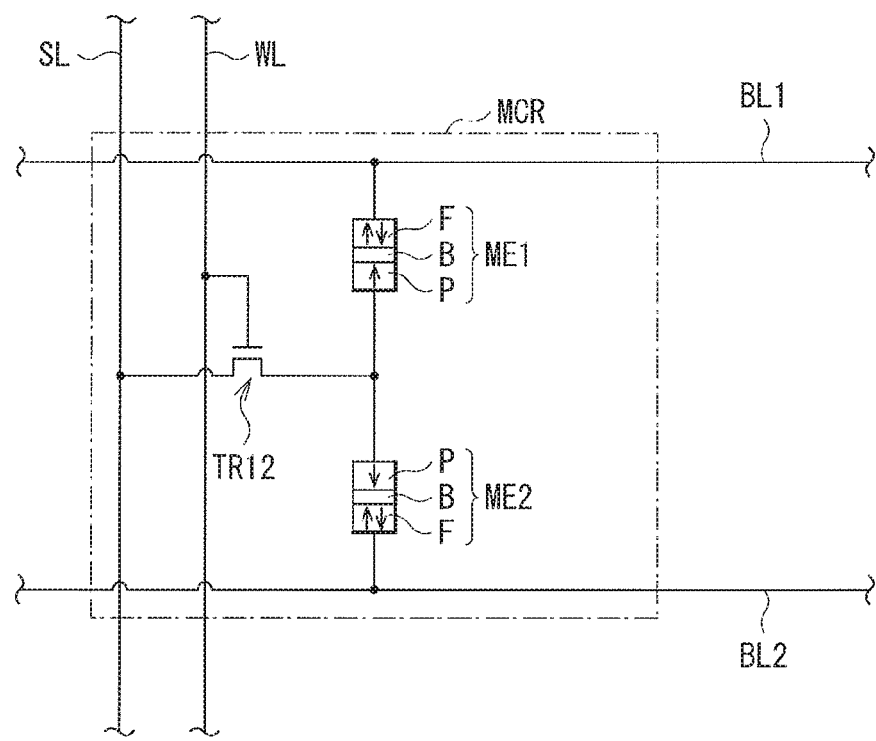

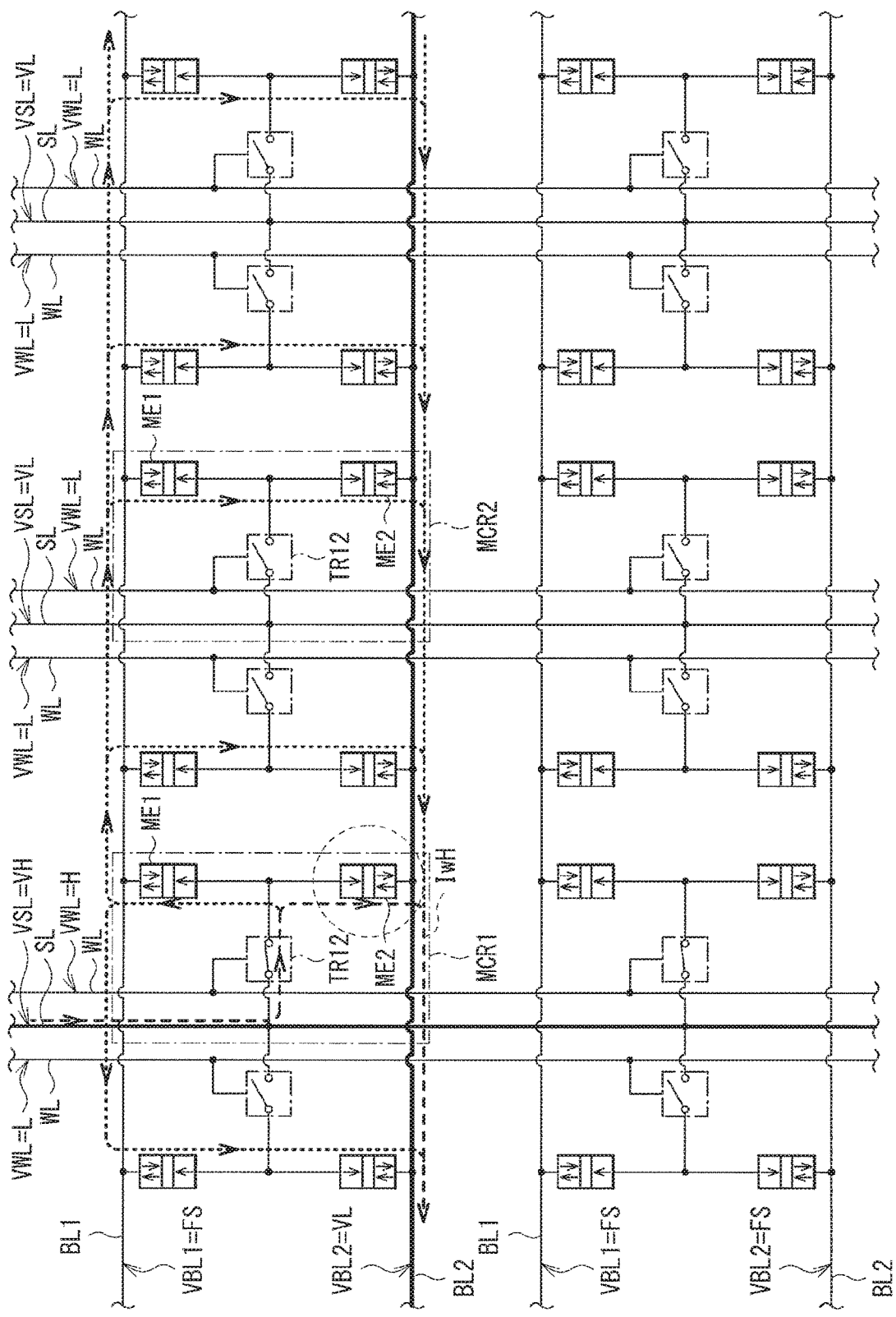
[FIG. 17]

[FIG. 18]
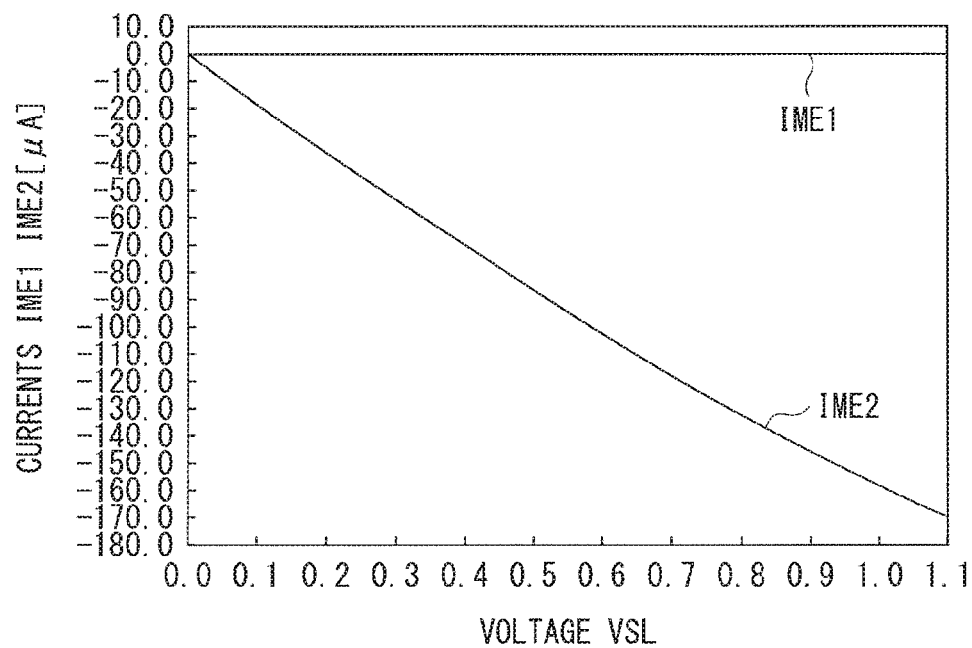
[FIG. 19]
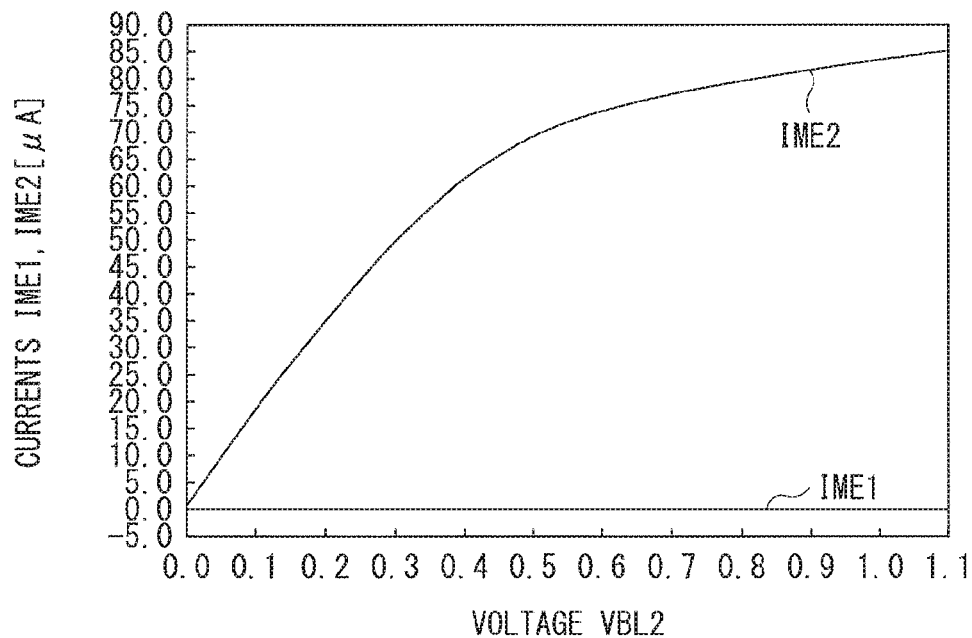

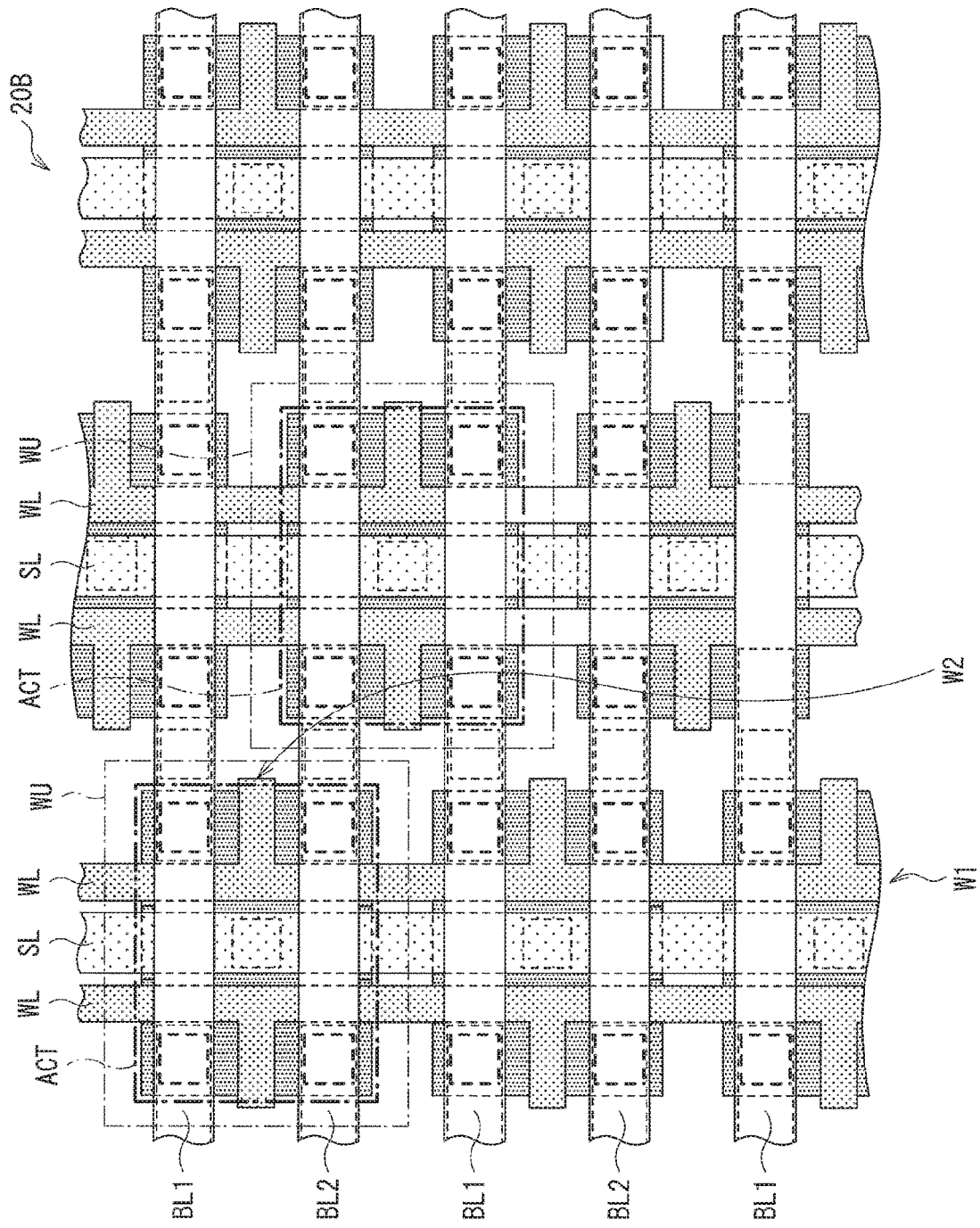
[FIG. 20]

[FIG. 21]
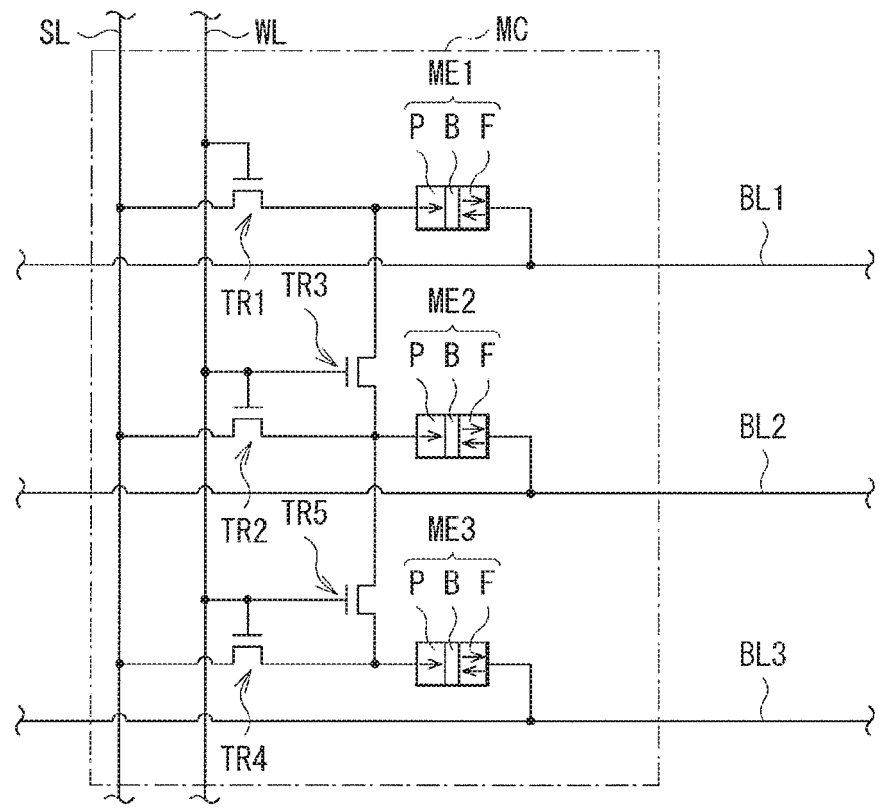
[FIG. 22]
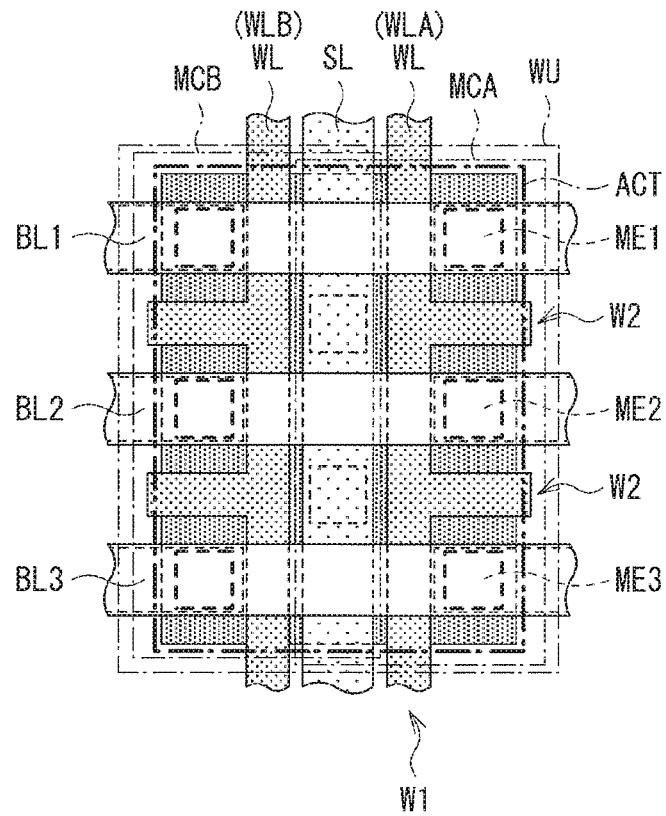

SEMICONDUCTOR DEVICE

CROSS REFERENCE TO RELATED APPLICATIONS

This application is a U.S. National Phase of International Patent Application No. PCT/JP2018/046922 filed on Dec. 20, 2018, which claims priority benefit of Japanese Patent Application No. JP 2018-002844 filed in the Japan Patent Office on Jan. 11, 2018. Each of the above-referenced applications is hereby incorporated herein by reference in its entirety.

TECHNICAL FIELD

The present disclosure relates to a semiconductor device that stores information.

BACKGROUND ART

In a nonvolatile storage device, a magnetic tunnel junction (MTJ: Magnetic Tunnel Junction) element of a spin transfer torque (STT: Spin Transfer Torque) type is often used as a memory element (e.g., PTL 1).

CITATION LIST

Patent Literature

PTL 1: Japanese Unexamined Patent Application Publication No. 2012-256690

SUMMARY OF THE INVENTION

Incidentally, as for a storage device, high reliability of stored information is desired, and a further improvement in the reliability is expected.

It is desirable to provide a semiconductor device that makes it possible to further improve reliability of stored information.

A semiconductor device in an embodiment of the present disclosure includes a first gate electrode, a first memory element, and a second memory element. The first gate electrode includes a first main line section, and one or a plurality of first sub line sections. The first main line section extends in a first direction in a first active region of a semiconductor substrate, and segments the first active region into a first region and a second region. The first sub line section extends in a second direction intersecting the first direction, and segments the first region into a plurality of sub regions including a first sub region and a second sub region. The first memory element includes a first terminal, and a second terminal coupled to the first sub region of the semiconductor substrate, and is configured to be set in a first resistive state or a second resistive state. The second memory element includes a first terminal, and a second terminal coupled to the second sub region of the semiconductor substrate, and is configured to be set in the first resistive state or the second resistive state.

In the semiconductor device according to the embodiment of the present disclosure, the first gate electrode including the first main line section and the one or the plurality of first sub line sections is formed in the first active region of the semiconductor substrate. The first main line section is formed to extend in the first direction, in the first active region. The first active region is segmented into the first region and the second region by the first main line section. The one or the plurality of sub line sections extends from the first main line section in the second direction intersecting the first direction, in the first region. The first region is segmented into the plurality of sub regions including the first sub region and the second sub region by the one or the plurality of sub line sections. The second terminal of the first memory element is coupled to the first sub region of the semiconductor substrate. The second terminal of the second memory element is coupled to the second sub region of the semiconductor substrate.

According to the semiconductor device in the embodiment of the present disclosure, the first main line section and the one or the plurality of first sub line sections are provided in the first gate electrode. Thus, it is possible to increase reliability of stored information. It is to be noted that the effects described herein are not necessarily limitative, and any of effects described in the present disclosure may also be provided.

BRIEF DESCRIPTION OF DRAWINGS

FIG. 1 is a block diagram illustrating a configuration example of a semiconductor device according to an embodiment of the present disclosure.

FIG. 2 is a circuit diagram illustrating a configuration example of a memory cell illustrated in FIG. 1.

FIG. 3 is a circuit diagram illustrating a configuration example of a memory cell array illustrated in FIG. 1.

FIG. 4 is an explanatory diagram illustrating an operation example of a memory element illustrated in FIG. 2.

FIG. 5 is a layout diagram illustrating a configuration example of the memory cell array illustrated in FIG. 3.

FIG. 6 is a cross-sectional view of a configuration example of the memory cell array illustrated in FIG. 5.

FIG. 7 is another cross-sectional view of the configuration example of the memory cell array illustrated in FIG. 5.

FIG. 8 is another cross-sectional view of the configuration example of the memory cell array illustrated in FIG. 5.

FIG. 9 is an explanatory diagram illustrating an operation example in a standby state of the semiconductor device illustrated in FIG. 1.

FIG. 10 is an explanatory diagram illustrating an example of write operation of the semiconductor device illustrated in FIG. 1.

FIG. 11 is an explanatory diagram illustrating another example of write operation of the semiconductor device illustrated in FIG. 1.

FIG. 12 is an explanatory diagram illustrating another example of write operation of the semiconductor device illustrated in FIG. 1.

FIG. 13 is an explanatory diagram illustrating another example of write operation of the semiconductor device illustrated in FIG. 1.

FIG. 14 is an explanatory diagram illustrating an example of readout operation of the semiconductor device illustrated in FIG. 1.

FIG. 15 is an explanatory diagram illustrating another example of readout operation of the semiconductor device illustrated in FIG. 1.

FIG. 16 is a circuit diagram illustrating a configuration example of a memory cell in a semiconductor device according to a comparative example.

FIG. 17 is an explanatory diagram illustrating an example of write operation of the semiconductor device according to the comparative example.

FIG. 18 is a characteristic diagram illustrating a characteristic example of the semiconductor device illustrated in FIG. 1.

FIG. 19 is another characteristic diagram illustrating a characteristic example of the semiconductor device illustrated in FIG. 1.

FIG. 20 is a layout diagram illustrating a configuration example of a memory cell array according to a modification example.

FIG. 21 is a circuit diagram illustrating a configuration example of a memory cell according to another modification example.

FIG. 22 is a layout diagram illustrating a configuration example of the memory cell illustrated in FIG. 21.

MODES FOR CARRYING OUT THE INVENTION

Some embodiments of the present disclosure are described below in detail with reference to the drawings

Embodiment

Configuration Example

FIG. 1 illustrates a configuration example of a semiconductor device (a semiconductor device 1) according to an embodiment. The semiconductor device 1 includes a controller 11, a memory cell array 20, and drivers 12 and 13.

The controller 11 controls operation of the semiconductor device 1. Specifically, the controller 11 controls operation of the drivers 12 and 13 to write information in a memory cell MC (described later) of the memory cell array 20, on the basis of a write command and write data supplied from outside. Further, the controller 11 controls the operation of the drivers 12 and 13 to read information from the memory cell MC, on the basis of a readout command supplied from outside.

The memory cell array 20 is an array in which the memory cells MC are arranged in a matrix.

FIGS. 2 and 3 illustrate a configuration example of the memory cell array 20. The memory cell array 20 includes a plurality of source lines SL, a plurality of word lines WL, a plurality of bit lines BL1, and a plurality of bit lines BL2. The source line SL extends in a vertical direction in FIGS. 2 and 3, and one end of the source line SL is coupled to the driver 12. The word line WL extends in the vertical direction in FIGS. 2 and 3, and one end of the word line WL is coupled to the driver 12. The bit line BL1 extends in a lateral direction in FIGS. 2 and 3, and one end of the bit line BL1 is coupled to the driver 13. The bit line BL2 extends in the lateral direction in FIGS. 2 and 3, and one end of the bit line BL2 is coupled to the driver 13.

The memory cell MC includes transistors TR1, TR2, and TR3, and two memory elements ME1 and ME2, as illustrated in FIG. 2.

The transistors TR1, TR2, and TR3 are each an N-type MOS (Metal Oxide Semiconductor) transistor. A gate of the transistor TR1 is coupled to the word line WL, a source thereof is coupled to the source line SL, and a drain thereof is coupled to the memory element MEL A gate of the transistor TR2 is coupled to the word line WL, a source thereof is coupled to the source line SL, and a drain thereof is coupled to the memory element ME2. A gate of the transistor TR3 is coupled to the word line WL, one of a source and a drain thereof is coupled to the memory element ME1, and the other is coupled to the memory element ME2.

Each of the two memory elements ME1 and ME2 is a nonvolatile memory element, and is, in this example, a magnetic tunnel junction element of a spin transfer torque type (STT-MTJ) that stores information by changing an orientation of magnetization of a free layer F (described later) by spin injection. Each of the memory elements ME1 and ME2 includes a pinned layer P, a tunnel barrier layer B, and the free layer F. The pinned layer P of the memory element ME1 is coupled to the drain of the transistor TR1, and the free layer F is coupled to the bit line BL1. The pinned layer P of the memory element ME2 is coupled to the drain of the transistor TR2, and the free layer is coupled to the bit line BL2. In this example, the memory elements ME1 and ME2 each have a so-called bottom-pinned structure in which the pinned layer P, the tunnel barrier layer B, and the free layer F are stacked in this order from lower-layer side of the semiconductor device 1.

The pinned layer P is configured by a ferromagnetic substance in which a direction of magnetization is fixed, for example, in a film-surface vertical direction. The free layer F is configured by a ferromagnetic substance in which a direction of magnetization changes, for example, in the film-surface vertical direction, depending on a spin polarization current that flows in. The tunnel barrier layer B serves to break magnetic coupling between the pinned layer P and the free layer F, and feed a tunneling current.

With this configuration, for example, in the memory element ME1, as illustrated in FIG. 4, when, for example, a current (a write current IwL) is fed from the free layer F to the pinned layer P, a polarized electron having a moment (a spin) in the same direction as that of the magnetization of the pinned layer P is injected from the pinned layer P into the free layer F, and the direction of the magnetization of the free layer F becomes the same direction as the direction of the magnetization of the pinned layer P (a parallel state). In the memory element ME1, in a case of entering such a parallel state, a resistance value between both ends becomes low (a low resistive state RL).

Further, for example, in the memory element ME1, as illustrated in FIG. 4, when, for example, a current (a write current IwH) is fed from the pinned layer P to the free layer F, an electron is injected from the free layer F into the pinned layer P. At that time, among the injected electrons, a polarized electron having a moment in the same direction as that of the magnetization of the pinned layer P passes through the pinned layer P, and a polarized electron having a moment in a direction opposite to that of the magnetization of the pinned layer P is reflected by the pinned layer P and injected into the free layer F. This makes the direction of the magnetization of the free layer F become the direction opposite to the direction of the magnetization of the pinned layer P (an antiparallel state). In the memory element ME, in a case of entering such an antiparallel condition, the resistance value between both becomes high (a high resistive state RH).

The operation is described above using the memory element ME1 as an example, but this also holds true for the memory element ME2. In this way, in each of the memory elements ME1 and ME2, the resistive state changes between the high resistive state RH and the low resistive state RL, owing to a change in the direction of the magnetization of the free layer F depending on the direction in which the current is fed. Setting the resistive state in this way enables each of the memory elements ME1 and ME2 to store information. The memory cell MC is able to store information for 2 bits, using these two memory elements ME1 and ME2.

As illustrated in FIG. 3, in the memory cell array 20, the plurality of memory cells MC is disposed by a memory unit MU including two memory cells (memory cells MCA and MCB). The memory cells MCA and MCB belonging to the one memory unit MU share the source line SL and the bit lines BL1 and BL2. In other words, the source of each of the transistors TR1 and TR2 of the memory cell MCA and the source of each of the transistors TR1 and TR2 of the memory cell MCB are coupled to the one source line SL, the free layer F of the memory element ME1 of the memory cell MCA and the free layer F of the memory element ME1 of the memory cell MCB are coupled to the one bit line BL1, and the free layer F of the memory element ME2 of the memory cell MCA and the free layer F of the memory element ME2 of the memory cell MCB are coupled to the one bit line BL2. In the following, for convenience of description, the word line WL pertaining to the memory cell MCA in the memory unit MU is also referred to as the word line WLA, and the word line WL pertaining to the memory cell MCB in the memory unit MU is also referred to as the word line WLB.

FIG. 5 illustrates an example of a layout in the memory cell array 20. FIG. 6 illustrates a cross-sectional configuration in a VI-VI arrow direction in FIG. 5. FIG. 7 illustrates a cross-sectional configuration in a VII-VII arrow direction in FIG. 5. FIG. 8 illustrates a cross-sectional configuration in a VIII-VIII arrow direction in FIG. 5.

A surface of the semiconductor substrate SUB is provided with a plurality of active regions ACT surrounded by an element separating layer STI (FIGS. 6 to 8), and the memory unit MU is formed in each of the active regions ACT. The word line WL is, in this example, configured to be integral with a gate electrode of each of the transistors TR1, TR2, and TR3.

As illustrated in FIG. 5, the word line WLA includes a main line section W1 extending in a vertical direction while passing through the active region ACT, and a sub line section W2 extending in a right direction from the main line section W1 in the vicinity of the middle in the vertical direction of the active region ACT. The three transistors TR1, TR2, and TR3 of the memory cell MCA are formed by this word line WLA. In other words, the transistors TR1 and TR2 are formed by segmenting the active region ACT by the main line section W1 of the word line WLA, and the transistor TR3 is formed by segmenting the active region ACT by the sub line section W2 of the word line WLA.

Similarly, the word line WLB includes the main line section W1 extending in the vertical direction while passing through the active region ACT, and the sub line section W2 extending in a left direction from the main line section W1 in the vicinity of the middle in the vertical direction of the active region ACT. The three transistors TR1, TR2, and TR3 of the memory cell MCB are formed by this word line WLB.

As illustrated in FIGS. 6 and 7, the element separating layer STI, a P well PW, and diffusion layers 101N, 102N, 103N, and 104N are formed on the surface of the semiconductor substrate SUB. The element separating layer STI is Shallow Trench Isolation, and the P well PW is formed in the active region ACT surrounded by this element separating layer STI. The diffusion layer 101N is an N-type diffusion layer formed in a partial region on a surface of the P well PW, and corresponds to the drain of the transistor TR1 of the memory cell MCA. The diffusion layer 102N is an N-type diffusion layer formed in a partial region on the surface of the P well PW, and corresponds to the source of the transistor TR1 of the memory cell MCA, and the source of the transistor TR1 of the memory cell MCB. The diffusion layer 103N is an N-type diffusion layer formed in a partial region on the surface of the P well PW, and corresponds to the drain of the transistor TR1 of the memory cell MCB. The diffusion layer 104N is an N-type diffusion layer formed in a partial region on the surface of the P well PW, and corresponds to the drain of the transistor TR2 of the memory cell MCA.

As illustrated in FIG. 6, on the P well PW in a region between the diffusion layers 101N and 102N, a gate oxide film GO and the gate electrode (the word line WLA) are formed in this order. The word line WLA and the diffusion layers 101N and 102N thereby configure the transistor TR1 of the memory cell MCA. On the P well PW in a region between the diffusion layers 102N and 103N, the gate oxide film GO and the gate electrode (the word line WLB) are formed in this order. The word line WLB and the diffusion layers 102N and 103N thereby configure the transistor TR1 of the memory cell MCB. It is to be noted that, although the cross-sectional configuration along the bit line BL1 is described with reference to FIG. 6, this also holds true for a cross-sectional configuration along the bit line BL2, and the transistor TR2 of the memory cell MCA and the transistor TR2 of the memory cell MCB are each formed as with the two transistors TR1 illustrated in FIG. 6.

As illustrated in FIG. 7, on the P well PW in a region between the diffusion layers 101N and 104N, the gate oxide film GO and the gate electrode (the word line WLA) are formed in this order. The word line WLA and the diffusion layers 101N and 104N thereby configure the transistor TR3 of the memory cell MCA. This also holds true for the transistor TR3 of the memory cell MCB.

As illustrated in FIG. 6, on the diffusion layer 101N, a contact CT and the memory element ME1 of the memory cell MCA are formed in this order. In this memory element ME1, although not illustrated, the pinned layer P, the tunnel barrier layer B, and the free layer F are formed in this order from the lower-layer side. An upper end of this memory element ME1 is coupled to a wiring line 111. This wiring line 111 is formed using a metal wiring layer M1 of a first layer. In addition, this wiring line 111 is coupled to the bit line BL1 through a via VA. The bit line BL1 is formed using a metal wiring layer M2 of a second layer. Similarly, on the diffusion layer 103N, the contact CT and the memory element ME1 of the memory cell MCB are formed in this order. An upper end of this memory element ME1 is coupled to a wiring line 112. This wiring line 112 is formed using the metal wiring layer M1 of the first layer, as with the wiring line 111. In addition, this wiring line 112 is coupled to the bit line BL1 through the via VA. It is to be noted that, although the cross-sectional configuration along the bit line BL1 is described with reference to FIG. 6, this also holds true for the cross-sectional configuration along the bit line BL2, and as with the two memory elements ME1 illustrated in FIG. 6, the memory element ME2 of the memory cell MCA and the memory element ME2 of the memory cell MCB are each formed, and an upper end of each of these two memory elements ME2 is coupled to the bit line BL2 through the wiring line and the via VA. Under the metal wiring layer M1, between the metal wiring layer M1 and the metal wiring layer M2, and on the metal wiring layer M2, an interlayer insulating film IL is formed.

On the diffusion layer 102N, as illustrated in FIG. 8, the contact CT and a contact CT2 are formed in this order. The contact CT2 has about the same height as those of the memory element ME1 (FIG. 6) and the memory element ME2. The diffusion layer 102N is coupled to the source line SL through these contacts CT and CT2. The source line SL is formed using the metal wiring layer M1 of the first layer.

The driver 12 (FIG. 1) applies a voltage VSL to the source line SL, and applies a voltage VWL to the word line WL, on the basis of a control signal supplied from the controller 11.

The driver 13 applies voltages VBL1 and VBL2 to the bit lines BL1 and BL2, respectively, or makes the bit lines BL1 and BL2 floating, on the basis of a control signal supplied from the controller 11. The driver 13 includes a sense amplifier 14. The sense amplifier 14 reads out information stored in the memory cell MC, on the basis of a current flowing through each of the bit lines BL1 and BL2, in readout operation. In addition, the driver 13 supplies the read-out information to the controller 11.

Here, the word line WLA corresponds to a specific example of a "first gate electrode" in the present disclosure. The region where the diffusion layer 102N is formed corresponds to a specific example of a "first region" in the present disclosure. The region where the diffusion layer 101N is formed corresponds to a specific example of a "first sub region" in the present disclosure. The region where the diffusion layer 104N is formed corresponds to a specific example of a "second sub region" in the present disclosure. The memory element ME1 corresponds to a specific example of a "first memory element" in the present disclosure. The memory element ME2 corresponds to a specific example of a "second memory element" in the present disclosure. The drivers 12 and 13 each correspond to a specific example of a "driver" in the present disclosure.

[Operation and Workings]

Next, operation and workings of the semiconductor device 1 of the present embodiment are described.

(Outline of Overall Operation)

First, an outline of overall operation of the semiconductor device 1 is described with reference to FIG. 1. The controller 11 controls operation of the memory cell array 20. Specifically, the controller 11 controls operation of the drivers 12 and 13 to write information in the memory cell MC of the memory cell array 20, on the basis of a write command and write data supplied from outside. Further, the controller 11 controls the operation of the drivers 12 and 13 to read out information from the memory cell MC, on the basis of a readout command supplied from outside. The driver 12 applies the voltage VSL to the source line SL, and applies the voltage VWL to the word line WL, on the basis of a control signal supplied from the controller 11. The driver 13 applies the voltages VBL1 and VBL2 to the bit lines BL1 and BL2, respectively, or makes the bit lines BL1 and BL2 floating, on the basis of a control signal supplied from the controller 11. Further, the sense amplifier 14 of the driver 13 reads out information stored in the memory cell MC, on the basis of a current flowing through each of the bit lines BL1 and BL2 in readout operation. In addition, the driver 13 supplies the read-out information to the controller 11.

(Detailed Operation)

Next, a standby state, write operation, and readout operation are described in detail.

(Standby State)

FIG. 9 illustrates an example of the standby state. In FIG. 9, the transistors TR1, TR2, and TR3 are illustrated as switches indicating ON-OFF states of these transistors.

In the standby state, the driver 12 sets the voltages VSL of all the source lines SL to a low-level voltage VL (e.g., 0 V), and sets the voltages VWL of all the word lines WL to a low level L. Further, the driver 13 sets the voltages VBL1 of all the bit lines BL1 to the low-level voltage VL (e.g., 0 V), and sets the voltages VBL2 of all the bit lines BL2 to the low-level voltage VL (e.g., 0 V). In all the memory cells MC, the transistors TR1, TR2, and TR3 are thereby brought into an OFF state. As a result, the resistive state of each of the memory elements ME1 and ME2 is maintained.

(Write Operation for Memory Element ME1)

Next, about operation of writing information in the memory element ME1 of a certain memory cell MC (a memory cell MC1) among the plurality of memory cells MC, an example of setting the resistive state of the memory element ME1 to the high resistive state RH is described, and subsequently, an example of setting the resistive state of the memory element ME1 to the low resistive state RL is described.

FIG. 10 illustrates an example of write operation in a case of bringing the resistive state of the memory element ME1 of the memory cell MC1 into the high resistive state RH. In FIG. 10, "FS" indicates a floating state.

In the write operation in the case of bringing the resistive state of the memory element ME1 into the high resistive state RH, the driver 12 sets the voltage VSL of the source line SL pertaining to the memory element ME1 that is a writing target to the high-level voltage VH (e.g., 0.5 V), and sets the voltages VSL of the other source lines SL to the low-level voltage VL (e.g., 0 V). Further, the driver 12 sets the voltage VWL of the word line WL pertaining to the memory element ME1 that is the writing target to a high level H, and sets the voltages VWL of the other word lines WL to the low level L. Furthermore, the driver 13 sets the voltage VBL1 of the bit line BL1 pertaining to the memory element ME1 that is the writing target to the low-level voltage VL (e.g., 0 V), and brings the other bit lines BL1 and all the bit lines BL2 into the floating state.

The transistors TR1, TR2, and TR3 in the memory cell MC1 to which the memory element ME1 that is the writing target belongs are thereby brought into an ON state, and the write current IwH flows from the driver 12 to the source line SL, the transistors TR1 to TR3, the memory element ME1 that is the writing target, the bit line BL1, and the driver 13 in this order. At this moment, in the memory element ME1, the write current IwH flows from the pinned layer P to the free layer F, and thus the direction of the magnetization of the free layer F becomes the direction opposite to the direction of the magnetization of the pinned layer P (the antiparallel state), and, as a result, the resistive state of the memory element ME1 becomes the high resistive state RH.

Meanwhile, the bit line BL2 is in the floating state, and thus the current does not flow through the memory element ME2 in this memory cell MC1. As a result, the resistive state of this memory element ME2 is maintained. Further, in all the memory cells MC coupled to the word line WL pertaining to this memory cell MC1, the transistors TR1, TR2, and TR are brought into the ON state, but in the memory cells MC except for the memory cell MC1, the bit lines BL1 and BL2 are both in the floating state, and thus the write current IwH does not flow. As a result, the resistive states of the memory elements ME1 and ME2 in each of these memory cells MC are maintained.

FIG. 11 illustrates an example of write operation in a case of bringing the resistive state of the memory element ME1 of the memory cell MC1 into the low resistive state RL.

In the write operation in the case of bringing the resistive state of the memory element ME1 into the low resistive state RL, the driver 12 sets the voltages VSL of all the source lines SL to the low-level voltage VL (e.g., 0 V). Further, the driver 12 sets the voltage VWL of the word line WL pertaining to the memory element ME1 that is the writing target to the high level H, and sets the voltages VWL of the other word lines WL to the low level L. Furthermore, the driver 13 sets the voltage VBL1 of the bit line BL1 pertaining to the memory element ME1 that is the writing target to the high-level voltage VH (e.g., 0.5 V), and brings the other bit lines BL1 and all the bit lines BL2 into the floating state.

This brings the transistors TR1, TR2, and TR3 in the memory cell MC1 to which the memory element ME1 that is the writing target belongs into the ON state, and the write current IwL flows from the driver 13 to the bit line BL1, the memory element ME1 that is the writing target, the transistors TR1 to TR3, the source line SL, and the driver 12 in this order. At this moment, in the memory element ME1, the write current IwL flows from the free layer F to the pinned layer P, and thus the direction of the magnetization of the free layer F becomes the same direction as the direction of the magnetization of the pinned layer P (the parallel state), and, as a result, the resistive state of the memory element ME1 becomes the low resistive state RL.

Meanwhile, the bit line BL2 is in the floating state, and thus the current does not flow through the memory element ME2 in this memory cell MC1. As a result, the resistive state of this memory element ME2 is maintained. Further, in all the memory cells MC coupled to the word line WL pertaining to this memory cell MC1, the transistors TR1, TR2, and TR are brought into the ON state, but in the memory cells MC except for the memory cell MC1, the bit lines BL1 and BL2 are both in the floating state, and thus the write current IwL does not flow. As a result, the resistive states of the memory elements ME1 and ME2 in each of these memory cells MC are maintained.

(Write Operation for Memory Element ME2)

Next, about operation of writing information in the memory element ME2 of a certain memory cell MC (the memory cell MC1) among the plurality of memory cells MC, an example of setting the resistive state of the memory element ME2 to the high resistive state RH is described, and subsequently, an example of setting the resistive state of the memory element ME2 to the low resistive state RL is described.

FIG. 12 illustrates an example of write operation in a case of bringing the resistive state of the memory element ME2 of the memory cell MC1 into the high resistive state RH.

In the write operation in the case of bringing the resistive state of the memory element ME2 into the high resistive state RH, the driver 12 sets the voltage VSL of the source line SL pertaining to the memory element ME2 that is a writing target to the high-level voltage VH (e.g., 0.5 V), and sets the voltages VSL of the other source lines SL to the low-level voltage VL (e.g., 0 V). Further, the driver 12 sets the voltage VWL of the word line WL pertaining to the memory element ME2 that is the writing target to the high level H, and sets the voltages VWL of the other word lines WL to the low level L. Furthermore, the driver 13 sets the voltage VBL2 of the bit line BL2 pertaining to the memory element ME2 that is the writing target to the low-level voltage VL (e.g., 0 V), and brings the other bit lines BL2 and all the bit lines BL1 into the floating state.

The transistors TR1, TR2, and TR3 in the memory cell MC1 to which the memory element ME2 that is the writing target belongs are thereby brought into the ON state, and the write current IwH flows from the driver 12 to the source line SL, the transistors TR1 to TR3, the memory element ME2 that is the writing target, the bit line BL2, and the driver 13 in this order. As a result, the resistive state of the memory element ME2 becomes the high resistive state RH.

Meanwhile, the write current IwH does not flow through the memory element ME1 in this memory cell MC1, and the memory elements ME1 and ME2 in the memory cells MC except for this memory cell MC1 among the memory cells MC coupled to the word line WL pertaining to this memory cell MC1, and thus the resistive states are maintained.

FIG. 13 illustrates an example of write operation in a case of bringing the resistive state of the memory element ME2 of the memory cell MC1 into the low resistive state RL.

In the write operation in the case of bringing the resistive state of the memory element ME2 into the low resistive state RL, the driver 12 sets the voltages VSL of all the source lines SL to the low-level voltage VL (e.g., 0 V). Further, the driver 12 sets the voltage VWL of the word line WL pertaining to the memory element ME2 that is the writing target to the high level H, and sets the voltages VWL of the other word lines WL to the low level L. Furthermore, the driver 13 sets the voltage VBL2 of the bit line BL2 pertaining to the memory element ME2 that is the writing target to the high-level voltage VH (e.g., 0.5 V), and brings the other bit lines BL2 and all the bit lines BL1 into the floating state.

This brings the transistors TR1, TR2, and TR3 in the memory cell MC1 to which the memory element ME2 that is the writing target belongs into the ON state, and the write current IwL flows from the driver 13 to the bit line BL2, the memory element ME2 that is the writing target, the transistors TR1 to TR3, the source line SL, and the driver 12 in this order. As a result, the resistive state of the memory element ME2 becomes the low resistive state RL.

Meanwhile, the write current IwL does not flow through the memory element ME1 in this memory cell MC1, and the memory elements ME1 and ME2 in the memory cells MC except for this memory cell MC1 among the memory cells MC coupled to the word line WL pertaining to this memory cell MC1, and thus the resistive states are maintained.

(Readout Operation for Memory Element ME1)

Next, operation of reading out information from the memory element ME1 of a certain memory cell MC (the memory cell MC1) among the plurality of memory cells MC is described.

FIG. 14 illustrates an example of readout operation of reading out the resistive state of the memory element ME1.

In the readout operation, the driver 12 sets the voltage VSL of the source line SL pertaining to the memory element ME1 that is a readout target to a predetermined readout voltage VR (e.g., 0.1 V), and sets the voltages VSL of the other source lines SL to the low-level voltage VL (e.g., 0 V). Further, the driver 12 sets the voltage VWL of the word line WL pertaining to the memory element ME1 that is the readout target to the high level H, and sets the voltages VWL of the other word lines WL to the low level L. Furthermore, the driver 13 sets the voltage VBL1 of the bit line BL1 pertaining to the memory element ME1 that is the readout target to the low-level voltage VL (e.g., 0 V), and brings the other bit lines BL1 and all the bit lines BL2 into the floating state.

This brings the transistors TR1, TR2, and TR3 in the memory cell MC1 to which the memory element ME1 that is the readout target belongs into the ON state, and a readout current Tread flows from the driver 12 to the source line SL, the transistors TR1 to TR3, the memory element ME1 that is the readout target, the bit line BL1, and the driver 13 in this order. This readout current Tread is sufficiently small as compared with the write current IwH, and thus the resistive state of the memory element ME1 remains unchanged. A current value of the readout current Iread changes depending on the resistive state of the memory element MEL In other words, the current value of the readout current Iread is small in a case where the resistive state of the memory element ME1 is the high resistive state RH, and the current value of the readout current Iread is large in a case where the resistive state of the memory element ME1 is the low resistive state RL. The sense amplifier 14 of the driver 13 is able to detect whether the resistive state of the memory element ME1 is the high resistive state RH or the low resistive state RL, on the basis of this readout current Iread.

(Readout Operation for Memory Element ME2)

Next, operation of reading out information from the memory element ME2 of a certain memory cell MC (the memory cell MC1) among the plurality of memory cells MC is described.

FIG. 15 illustrates an example of readout operation of reading out the resistive state of the memory element ME2.

In the readout operation, the driver 12 sets the voltage VSL of the source line SL pertaining to the memory element ME2 that is a readout target to the predetermined readout voltage VR (e.g., 0.1 V), and sets the voltages VSL of the other source lines SL to the low-level voltage VL (e.g., 0 V). Further, the driver 12 sets the voltage VWL of the word line WL pertaining to the memory element ME2 that is the readout target to the high level H, and sets the voltages VWL of the other word lines WL to the low level L. Furthermore, the driver 13 sets the voltage VBL2 of the bit line BL2 pertaining to the memory element ME2 that is the readout target to the low-level voltage VL (e.g., 0 V), and brings the other bit lines BL2 and all the bit lines BL1 into the floating state.

This brings the transistors TR1, TR2, and TR3 in the memory cell MC1 to which the memory element ME2 that is the readout target belongs into the ON state, and the readout current Tread flows from the driver 12 to the source line SL, the transistors TR1 to TR3, the memory element ME2 that is the readout target, the bit line BL2, and the driver 13 in this order. This readout current Tread is sufficiently small as compared with the write current IwH, and thus the resistive state of the memory element ME2 remains unchanged. The sense amplifier 14 of the driver 13 is able to detect whether the resistive state of the memory element ME2 is the high resistive state RH or the low resistive state RL, on the basis of this readout current Tread.

As described above, in the semiconductor device 1, the word line WL includes the main line section W1 and the sub line section W2. In addition, in each of the active regions ACT, the transistors TR1 and TR2 are formed by segmenting the active region ACT by the main line section W1 of the word line WLA, and the transistor TR3 is formed by segmenting the active region ACT by the sub line section W2 of the word line WLA. In the semiconductor device 1, for example, when information is to be written in the memory element ME1, the three transistors TR1, TR2, and TR3 of the memory cell MC1 to which the memory element ME1 that is a target for this writing belongs are thereby brought into the ON state, and thus it is possible to increase a gate width equivalently, thereby making it possible to secure a write current easily.

Further, in the semiconductor device 1, the transistor TR3 is formed by segmenting the active region ACT by the sub line section W2 of the word line WLA, and thus it is possible to provide the transistor TR3 between the memory element ME1 and the memory element ME2. In the semiconductor device 1, for example, this makes it possible to reduce a possibility that information is erroneously written in a memory element other than a memory element in which the information is supposed to be written, and also makes it possible to reduce power consumption, as described below in comparison with a comparative example.

Comparative Example

Next, a semiconductor device 1R according to a comparative example is described. This comparative example is different from the present embodiment in terms of configuration of a memory cell. Other configurations are similar to those of the present embodiment (FIG. 1). The semiconductor device 1R includes a memory cell array 20R. The memory cell array 20R is an array in which memory cells MCR are arranged in a matrix.

FIG. 16 illustrates a configuration example of the memory cell MCR of the memory cell array 20R. The memory cell MCR includes a transistor TR12, and two memory elements ME1 and ME2. The transistor TR12 is an N-type MOS transistor, a gate thereof is coupled to a word line WL, a source thereof is coupled to a source line SL, and a drain thereof is coupled to a pinned layer P of each of the memory elements ME1 and ME2. This transistor TR12 corresponds to the transistors TR1 and TR2 (FIG. 2) according to the present embodiment, and a gate width of the transistor TR12 is, for example, substantially equal to the sum of a gate width of the transistor TR1 and a gate width of the transistor TR2. In the memory cell MCR, the two memory elements ME1 and ME2 are thus electrically coupled to each other.

FIG. 17 illustrates an example of operation in a case of setting a resistive state of the memory element ME2 of a certain memory cell MCR (a memory cell MCR1) among the plurality of memory cells MCR to a high resistive state RH.

In write operation in a case of setting the resistive state of the memory element ME2 to the high resistive state RH, a driver 12 sets a voltage VSL of the source line SL pertaining to the memory element ME2 that is a writing target to a high-level voltage VH (e.g., 0.5 V), and sets the voltages VSL of the other source lines SL to a low-level voltage VL (e.g., 0 V). Further, the driver 12 sets a voltage VWL of the word line WL pertaining to the memory element ME2 that is the writing target to a high level H, and sets the voltages VWL of the other word lines WL to a low level L. Furthermore, a driver 13 sets a voltage VBL2 of a bit line BL2 pertaining to the memory element ME2 that is the writing target to the low-level voltage VL (e.g., 0 V), and brings the other bit lines BL2 and all the bit lines BL1 into a floating state.

This brings the transistor TR12 in the memory cell MCR1 to which the memory element ME2 that is the writing target belongs into an ON state, and a write current IwH flows from the driver 12 to the source line SL, the transistor TR12, the memory element ME2 that is the writing target, the bit line BL2, and the driver 13 in this order. As a result, the resistive state of the memory element ME2 becomes the high resistive state RH.

However, in this semiconductor device 1R, a current path also occurs in the memory cells MCR other than the memory cell MCR1 to which the memory element ME2 that is the writing target belongs. In other words, the two memory elements ME1 and ME2 are electrically coupled to each other in each (e.g., a memory cell MCR2 illustrated in FIG. 17) of the plurality of memory cells MCR coupled to this memory cell MCR1, through the two bit lines BL1 and BL2, and thus there is a possibility that a current flows via the bit line BL1 in the floating state and the two memory elements ME1 and ME2 of the memory cell MCR2. In this case, there is a possibility that a change occurs in the resistive state of each of the memory element ME1 of the memory cell MCR1 and the memory elements ME1 and ME2 of the memory cell MCR2. Further, in the semiconductor device 1R, there is a possibility that power consumption increases because a plurality of such current paths occurs.

In contrast, in the semiconductor device 1 according to the present embodiment, the transistor TR3 is provided between the memory element ME1 and the memory element ME2. Hence, in each (e.g., the memory cell MC2 illustrated in FIG. 12) of the plurality of memory cells MC coupled to the memory cell MC1 to which the memory element ME2 that is the writing target belongs through the two bit lines BL1 and BL2, the transistors TR1, TR2, and TR3 are in the OFF state, and thus the memory element ME1 and the memory element ME2 of the memory cell MC2 are not electrically coupled. For this reason, in the semiconductor device 1, the current does not flow through the memory elements ME1 and ME2 in this memory cell MC2, and thus it is possible to avoid a change in the resistive state of each of the memory element ME1 of the memory cell MC1 and the memory elements ME1 and ME2 of the memory cell MC2.

FIG. 18 illustrates a simulation example of a current IME1 that flows through the memory element ME1 and a current IME2 that flows through the memory element ME2, in the write operation (FIG. 12) in the case of bringing the resistive state of the memory element ME2 of the memory cell MC1 into the high resistive state RH. A horizontal axis indicates the voltage VSL of the source line SL pertaining to the memory cell MC1. A vertical axis indicates the current flowing from the free layer F to the pinned layer P in a case where the currents IME1 and IME2 are positive, and the current flowing from the pinned layer P to the free layer F in a case where the currents IME1 and IME2 are negative.

In this example, the voltage VWL of the word line WL pertaining to this memory cell MC1 is set to a high level (in this example, 1.1 V), the voltage VBL2 of the bit line BL2 is set to the low-level voltage VL (in this example, 0 V), and the bit line BL1 is set in the floating state. In addition, the voltage VSL of the source line is set in a range from 0 V to 1.1 V. Further, the temperature is set to 25 degrees.

As illustrated in FIG. 18, the higher the voltage VSL of the source line SL is, the more the current IME2 flows from the pinned layer P toward the free layer F in the memory element ME2, but the current IME1 hardly flows through the memory element MEL In other words, in the semiconductor device 1, the transistor TR3 is provided between the memory element ME1 and the memory element ME2, and thus this transistor TR3 performs element isolation, in the memory cells MC except for the memory cell MC1 to which the memory element that is the writing target belongs. For this reason, unlike the semiconductor device 1R according to the comparative example, a current path does not occur in the memory cells MC except for the memory cell MC1 to which the memory element that is the writing target belongs, and thus the current does not flow through the memory element MEL FIG. 19 illustrates a simulation example of the current IME1 that flows through the memory element ME1 and the current IME2 that flows through the memory element ME2, in the write operation (FIG. 13) in the case of bringing the resistive state of the memory element ME2 of the memory cell MC1 into the low resistive state RL. A horizontal axis indicates the voltage VBL2 of the bit line BL2 pertaining to the memory cell MC1.

In this example, the voltage VWL of the word line WL pertaining to this memory cell MC1 is set to the high level (in this example, 1.1 V), the voltage VSL of the source line SL is set to the low-level voltage VL (in this example, 0 V), and the bit line BL1 is set in the floating state. In addition, the voltage VBL2 of the bit line BL2 is set in a range from 0 V to 1.1 V. Further, the temperature is set to 25 degrees.

As illustrated in FIG. 19, the higher the voltage VBL2 of the bit line BL2 is, the more the current IME2 flows from the free layer F toward the pinned layer P in the memory element ME2, but the current IME1 hardly flows through the memory element ME1. In other words, in the semiconductor device 1, the transistor TR3 is provided between the memory element ME1 and the memory element ME2, and thus this transistor TR3 performs element isolation, in the memory cells MC except for the memory cell MC1 to which the memory element that is the writing target belongs. For this reason, unlike the semiconductor device 1R according to the comparative example, a current path does not occur in the memory cells MC except for the memory cell MC1 to which the memory element that is the writing target belongs, and thus the current does not flow through the memory element ME1.

In this way, in the semiconductor device 1, in each of the memory cells MC, the transistor TR3 is provided between the memory element ME1 and the memory element ME2, and thus it is possible to reduce a possibility that information is erroneously written in a memory element other than a memory element in which the information is supposed to be written.

Further, in the semiconductor device 1, a current path does not occur in the memory cells other than the memory cell MC1 to which the memory element that is the writing target belongs, and thus it is possible to suppress power consumption.

[Effects]

As described above, in the present embodiment, the transistor TR3 is formed by segmenting the active region by the sub line section of the word line, and thus, for example, it is possible to reduce a possibility that information is erroneously written in a memory element other than a memory element in which the information is supposed to be written, and it is also possible to reduce power consumption.

Modification Example 1

In the foregoing embodiment, as illustrated in FIG. 5, the memory units MU adjacent to each other in a lateral direction are disposed at the same positions in the vertical direction, but this is not limitative. Alternatively, for example, as represented by a memory cell array 20B illustrated in FIG. 20, the memory units MU adjacent to each other in the lateral direction may be disposed at the respective positions shifted with respect to each other in the vertical direction. This, for example, allows the positions of the sub line sections W2 in the memory units MU adjacent to each other in the lateral direction to be shifted with respect to each other, and thus makes it possible to reduce a possibility that a manufacturing failure occurs in a semiconductor manufacturing process.

Modification Example 2

In the foregoing embodiment, as illustrated in FIG. 2, the two memory elements ME1 and ME2 are provided in the one memory cell MC, but this is not limitative, and three or more memory elements may be provided alternatively. A semiconductor device 1C in which three memory elements are provided in the memory cell MC is described below in detail. The semiconductor device 1C includes a memory cell array 20C and a driver 13C.

FIG. 21 illustrates an example of the memory cell MC in the memory cell array 20C. The memory cell array 20C includes a plurality of bit lines BL3. The bit line BL3 extends in a lateral direction in FIG. 21, and one end of the bit line BL3 is coupled to the driver 13C. This memory cell MC includes transistors TR4 and TR5, and a memory element ME3. The transistors TR4 and TR5 are each an N-type MOS transistor. A gate of the transistor TR4 is coupled to the word line WL, a source thereof is coupled to the source line SL, and a drain thereof is coupled to the memory element ME3. A gate of the transistor TR5 is coupled to the word line WL, one of a source and a drain thereof is coupled to the memory element ME2, and the other is coupled to the memory element ME3. The pinned layer P of the memory element ME3 is coupled to the drain of the transistor TR4, and the free layer F is coupled to the bit line BL3. The driver 13C applies the voltages VBL1 to VBL3 to the bit lines BL1 to BL3, respectively, or makes the bit lines BL1 to BL3 floating, on the basis of a control signal supplied from the controller 11.

FIG. 22 illustrates an example of a layout in the memory cell array 20C. The memory unit MU including the two memory cells MC (the memory cells MCA and MCB) is formed in the active region ACT. The word line WLA includes the main line section W1 extending in a vertical direction while passing through the active region ACT, and the two sub line sections W2 extending in a right direction from the main line section W1. The five transistors TR1 to TR5 of the memory cell MCA are formed by this word line WLA. In other words, the transistors TR1, TR2, and TR4 are formed by segmenting the active region ACT by the main line section W1 of the word line WLA, and the transistors TR3 and TR5 are formed by segmenting the active region ACT by the sub line section W2 of the word line WLA. This also holds true for the word line WLB.

Modification Example 3

In the foregoing embodiment, the memory elements ME1 and ME2 are configured using the magnetic tunnel junction element, but this is not limitative. For example, it is possible to use any of various elements whose resistive state changes depending on a direction of a current flowing between two terminals. Specifically, it is possible to use, for example, a resistance-changing-type memory element, a phase-changing-type memory element, and the like, for the memory elements ME1 and ME2.

Other Modification Examples

Further, two or more of these modification examples may be combined.

Although the technology has been described above referring to the embodiment and the modification examples, the technology is not limited thereto, and may be modified in a variety of ways.

For example, in each of the above-described embodiments, the transistors TR1 to TR3 are each configured using the N-type MOS transistor, but this is not limitative. Alternatively, the transistors TR1 to TR3 may each be configured using a P-type MOS transistor.

Further, for example, voltage values of the high-level voltage VH, the low-level voltage VL, the readout voltage VR, and the like in each of the above-described embodiments, etc. are examples, and may be changed where appropriate.

It is to be noted that the effects described in the present specification are merely illustrative and not limitative, and may have other effects.

It is to be noted that the present technology may include the following configurations.

(1)
A semiconductor device including:
a first gate electrode that includes a first main line section and one or a plurality of first sub line sections, the first main line section extending in a first direction in a first active region of a semiconductor substrate, and segmenting the first active region into a first region and a second region, the one or the plurality of first sub line sections extending from the first main line section in a second direction intersecting the first direction in the first region, and segmenting the first region into a plurality of sub regions including a first sub region and a second sub region;
a first memory element that includes a first terminal, and a second terminal coupled to the first sub region of the semiconductor substrate, and is configured to be set in a first resistive state or a second resistive state; and
a second memory element that includes a first terminal, and a second terminal coupled to the second sub region of the semiconductor substrate, and is configured to be set in the first resistive state or the second resistive state.

(2)
The semiconductor device according to (1), further including a driver configured to apply a voltage to the first gate electrode, in which
the driver is configured to bring the first sub region, the second sub region, and the second region into electrical conduction with each other by applying a first voltage to the first gate electrode, and
the driver is configured to electrically separate the first sub region, the second sub region, and the second region from each other by applying a second voltage to the first gate electrode.

(3)
The semiconductor device according to (1) or (2), further including:
a second gate electrode that includes a second main line section and one or a plurality of second sub line sections, the second main line section extending in the first direction in a second active region of the semiconductor substrate, and segmenting the second active region into a third region and a fourth region, the one or the plurality of second sub line sections extending from the second main line section in a direction opposite to the second direction in the third region, and segmenting the third region into a plurality of sub regions including a third sub region and a fourth sub region;
a third memory element that includes a first terminal, and a second terminal coupled to the third sub region of the semiconductor substrate; and
a fourth memory element that includes a first terminal, and a second terminal coupled to the fourth sub region of the semiconductor substrate, wherein
the second active region is disposed adjacent to the second active region, in the second direction of the first active region, and
a placement position of the first active region and a placement position of the second active region in the first direction are shifted with respect to each other.

(4)
The semiconductor device according to (3), further including:
a first wiring line coupled to the first terminal of the first memory element;
a second wiring line coupled to the first terminal of the second memory element and the first terminal of the third memory element; and
a third wiring line coupled to the first terminal of the fourth memory element.

(5)

The semiconductor device according to any one of (1) to (4), further including:

a third gate electrode that includes a third main line section and one or a plurality of third sub line sections, the third main line section extending in the first direction in a third active region of the semiconductor substrate, and segmenting the third active region into a fifth region and a sixth region, the one or the plurality of third sub line sections extending from the third main line section in the second direction or a direction opposite to the second direction in the fifth region, and segmenting the fifth region into a plurality of sub regions including a fifth sub region and a sixth sub region;

a fifth memory element that includes a first terminal, and a second terminal coupled to the fifth sub region of the semiconductor substrate;

a sixth memory element that includes a first terminal, and a second terminal coupled to the sixth sub region of the semiconductor substrate;

a first wiring line coupled to the first terminal of the first memory element and the first terminal of the fifth memory element; and a second wiring line coupled to the first terminal of the second memory element and the first terminal of the sixth memory element.

(6)

The semiconductor device according to (5), in which the one or the plurality of third sub line sections extends in the direction opposite to the second direction, and the second region in the first active region and the sixth region in the third active region are a same region.

(7)

The semiconductor device according to any one of (1) to (6), further including:

a first wiring line coupled to the first terminal of the first memory element;

a second wiring line coupled to the first terminal of the second memory element;

a third wiring line coupled to the second region of the semiconductor substrate; and a driver configured to apply a voltage to the first gate electrode, the first wiring line, the second wiring line, and the third wiring line, wherein the driver is configured to perform driving operation of bringing the first sub region, the second sub region, and the second region into electrical conduction with each other by applying a first voltage to the first gate electrode, of applying voltages different from each other to the first wiring line and the third wiring line, and of bringing the second wiring line into a floating state.

(8)

The semiconductor device according to any one of (1) to (7), further including:

a first wiring line coupled to the first terminal of the first memory element and extending in the second direction;

a second wiring line coupled to the first terminal of the second memory element and extending in the second direction; and a third wiring line coupled to the second region of the semiconductor substrate and extending in the first direction.

(9)

The semiconductor device according to any one of (1) to (8), in which the first direction and the second direction are orthogonal to each other.

(10)

The semiconductor device according to any one of (1) to (9), in which the first memory element and the second memory element are each configured to store information by utilizing a resistive state changing reversibly depending on a direction of a current flowing between the first terminal and the second terminal.

(11)

The semiconductor device according to any one of (1) to (10), in which the first memory element and the second memory element are each a magnetic tunnel junction memory.

This application claims the benefit of Japanese Priority Patent Application JP2018-002844 filed with the Japan Patent Office on Jan. 11, 2018, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device, comprising:
a semiconductor substrate that includes a plurality of active regions;
a first gate electrode that includes a first main line section and at least one first sub line section, wherein
the first main line section extends, in a first direction, in a first active region of the plurality of active regions of the semiconductor substrate,
the first main line section segments the first active region into a first region and a second region,
the at least one first sub line section extends from the first main line section in a second direction,
the second direction intersects the first direction in the first region,
the at least one first sub line section segments the first region into a first plurality of sub regions, and
the first plurality of sub regions includes a first sub region and a second sub region;
a first memory element that includes a first terminal and a second terminal, wherein
the second terminal of the first memory element is coupled to the first sub region, and
the first memory element is configured to set in one of a first resistive state or a second resistive state;
a second memory element that includes a first terminal and a second terminal, wherein
the second terminal of the second memory element is coupled to the second sub region, and
the second memory element is configured to set in one of the first resistive state or the second resistive state; and
a driver configured to:
apply one of a first voltage or a second voltage to the first gate electrode;
set electrical conduction among the first sub region, the second sub region, and the second region based on the application of the first voltage to the first gate electrode; and
electrically separate the first sub region, the second sub region, and the second region based on the application of the second voltage to the first gate electrode.

2. The semiconductor device according to claim 1, further comprising:
a second gate electrode that includes a second main line section and at least one second sub line section, wherein
the second main line section extends, in the first direction, in a second active region of the plurality of active regions of the semiconductor substrate,
the second main line section segments the second active region into a third region and a fourth region,
the at least one second sub line section extends from the second main line section, in a third direction opposite to the second direction, in the third region,
the at least one second sub line section segments the third region into a second plurality of sub regions, and
the second plurality of sub regions that includes a third sub region and a fourth sub region;
a third memory element that includes a first terminal and a second terminal,
wherein
the second terminal of the third memory element is coupled to the third sub region; and
a fourth memory element that includes a first terminal and a second terminal, wherein
the second terminal of the fourth memory element is coupled to the fourth sub region,
the second active region is adjacent to the first active region in the second direction of the first active region, and
a placement position of the first active region in the first direction is shifted from a placement position of the second active region in the first direction.

3. The semiconductor device according to claim 2, further comprising:
a first wiring line coupled to the first terminal of the first memory element;
a second wiring line coupled to the first terminal of the second memory element and the first terminal of the third memory element; and
a third wiring line coupled to the first terminal of the fourth memory element.

4. The semiconductor device according to claim 1, further comprising:
a third gate electrode that includes a third main line section and at least one third sub line section, wherein
the third main line section extends, in the first direction, in a third active region of the plurality of active regions of the semiconductor substrate,
the third main line section segments the third active region into a fifth region and a sixth region,
the at least one third sub line section extends from the third main line section, in one of the second direction or a third direction opposite to the second direction, in the fifth region,
the at least one third line section segments the fifth region into a third plurality of sub regions, and
the third plurality of sub regions includes a fifth sub region and a sixth sub region;
a fifth memory element that includes a first terminal and a second terminal, wherein
the second terminal of the fifth memory element is coupled to the fifth sub region;
a sixth memory element that includes a first terminal and a second terminal, wherein the second terminal of the sixth memory element is coupled to the sixth sub region;
a first wiring line coupled to the first terminal of the first memory element and the first terminal of the fifth memory element; and
a second wiring line coupled to the first terminal of the second memory element and the first terminal of the sixth memory element.

5. The semiconductor device according to claim 4, wherein
the at least one third sub line section extends in the third direction opposite to the second direction, and
the second region in the first active region is the sixth region in the third active region.

6. The semiconductor device according to claim 1, further comprising:
a first wiring line coupled to the first terminal of the first memory element;
a second wiring line coupled to the first terminal of the second memory element; and
a third wiring line coupled to the second region, wherein the driver is further configured to:
apply the first voltage to the first wiring line;
apply the second voltage to the second wiring line;
apply a third voltage to the third wiring line; and
set a specific state of the second wiring line to a floating state based on the application of the second voltage to the second wiring line.

7. The semiconductor device according to claim 1, further comprising:
a first wiring line coupled to the first terminal of the first memory element, wherein the first wiring ling extends in the second direction;
a second wiring line coupled to the first terminal of the second memory element, wherein the second wiring line extends in the second direction; and
a third wiring line coupled to the second region, wherein the third wiring line extends in the first direction.

8. The semiconductor device according to claim 1, wherein the first direction is orthogonal to the second direction.

9. The semiconductor device according to claim 1, wherein
each of the first memory element and the second memory element is further configured to store information based on a corresponding resistive state,
the corresponding resistive state of each of the first memory element and the second memory element is one of the first resistive state or the second resistive state
the corresponding resistive state of the first memory element changes reversibly based on a first specific direction of a current flow between the first terminal of the first memory element and the second terminal of the first memory element, and
the corresponding resistive state of the second memory element changes reversibly based on a second specific direction of a current flow between the first terminal of the second memory element and the second terminal of the second memory element.

10. The semiconductor device according to claim 1, wherein each of the first memory element and the second memory element is a magnetic tunnel junction memory.

* * * * *